(12) United States Patent
Yoshida

(10) Patent No.: US 11,335,890 B2
(45) Date of Patent: May 17, 2022

(54) LIGHT-EMITTING DEVICE AND LIGHT-EMITTING SYSTEM

(71) Applicant: PIONEER CORPORATION, Tokyo (JP)

(72) Inventor: Ayako Yoshida, Tokyo (JP)

(73) Assignee: PIONEER CORPORATION, Tokyo (JP)

(*) Notice: Subject to any disclaimer, the term of this patent is extended or adjusted under 35 U.S.C. 154(b) by 0 days.

(21) Appl. No.: 16/471,204

(22) PCT Filed: Dec. 12, 2017

(86) PCT No.: PCT/JP2017/044464
§ 371 (c)(1),
(2) Date: Jun. 19, 2019

(87) PCT Pub. No.: WO2018/116894
PCT Pub. Date: Jun. 28, 2018

(65) Prior Publication Data
US 2020/0091466 A1     Mar. 19, 2020

(30) Foreign Application Priority Data

Dec. 19, 2016  (JP) .............................. JP2016-245789

(51) Int. Cl.
*H01L 51/52* (2006.01)
*B60Q 1/00* (2006.01)
(Continued)

(52) U.S. Cl.
CPC ........ *H01L 51/5284* (2013.01); *B60Q 1/0035* (2013.01); *B60Q 1/302* (2013.01);
(Continued)

(58) Field of Classification Search
CPC ............. H01L 51/5284; H01L 27/3202; H01L 2251/5361; H01L 51/50; B60Q 1/0035;
(Continued)

(56) References Cited

U.S. PATENT DOCUMENTS 5,897,201 A * 4/1999 Simon .................. G02B 6/0068
362/268
9,865,835 B2   1/2018 Shinjo et al.
(Continued)

FOREIGN PATENT DOCUMENTS

JP    2013-200964 A    10/2013
JP    2014-154566 A    8/2014
(Continued)

OTHER PUBLICATIONS

Machine translated document (Year: 2013).*
International Search Report for related International Application No. PCT/JP2017/044464, dated Mar. 20, 2018; 1 page.

*Primary Examiner* — Ahmed N Sefer
(74) *Attorney, Agent, or Firm* — Procopio, Cory, Hargreaves & Savitch LLP

(57) ABSTRACT

An end (that is, an end (130b)) of a second electrode (130) of a k-th light-emitting unit (152(k)) on a second side (S2) exists on the outer side of an end (152b) of the k-th light-emitting unit (152(k)) by the width WR(k) of an overlapping region (OR). In one example, the width WR(k) is equal to or greater than d×tan(arcsin(sin θl(k)/ns)) and equal to or less than 3d×tan(arcsin(sin θl(k)/ns)) (d×tan(arcsin(sin θl(k)/ns))≤WR(k)≤3d×tan(arcsin(sin θl(k)/ns))).

9 Claims, 21 Drawing Sheets

(51) Int. Cl.
*H01L 27/32* (2006.01)
*H01L 51/00* (2006.01)
*H05B 33/26* (2006.01)
*H05B 33/22* (2006.01)
*H05B 33/12* (2006.01)
*F21S 43/145* (2018.01)
*H05B 33/28* (2006.01)
*B60Q 1/30* (2006.01)

(52) U.S. Cl.
CPC ........ *F21S 43/145* (2018.01); *H01L 27/3202* (2013.01); *H01L 27/3204* (2013.01); *H01L 51/0096* (2013.01); *H01L 51/5221* (2013.01); *H01L 51/5231* (2013.01); *H05B 33/12* (2013.01); *H05B 33/22* (2013.01); *H05B 33/26* (2013.01); *H05B 33/28* (2013.01); *H01L 2251/5361* (2013.01); *Y02E 10/549* (2013.01)

(58) Field of Classification Search
CPC ....... B60Q 1/302; F21S 43/145; H05B 33/12; H05B 33/22; H05B 33/26; H05B 33/28
See application file for complete search history.

(56) References Cited

U.S. PATENT DOCUMENTS

| | | | |
|---|---|---|---|
| 2012/0314442 A1* | 12/2012 | Takahashi | F21S 41/24 362/538 |
| 2015/0069430 A1* | 3/2015 | Collins | H01L 33/44 257/89 |
| 2017/0294626 A1* | 10/2017 | Aoki | H01L 51/5221 |
| 2017/0340642 A1 | 11/2017 | Hartman et al. | |
| 2017/0373268 A1* | 12/2017 | Takahashi | H01L 51/0097 |
| 2017/0373278 A1 | 12/2017 | Harada et al. | |
| 2018/0069189 A1* | 3/2018 | Aoki | H01L 27/3244 |
| 2018/0266640 A1* | 9/2018 | Albou | F21S 41/33 |
| 2018/0345846 A1* | 12/2018 | Alisafaee | F21S 43/249 |
| 2019/0394842 A1* | 12/2019 | Arai | H01L 51/5265 |

FOREIGN PATENT DOCUMENTS

| | | | |
|---|---|---|---|
| JP | 2015-195173 A | | 11/2015 |
| JP | 2017204324 A | * | 11/2017 |
| JP | 2018-006382 A | | 1/2018 |
| WO | 2006/095118 A1 | | 9/2006 |
| WO | 2016/042638 A1 | | 3/2016 |
| WO | WO-2016042638 A1 | * | 3/2016 ......... H01L 51/524 |
| WO | WO 2016143045 | * | 9/2016 |

* cited by examiner

FIG. 9

| | EXAMPLE 1-1 | EXAMPLE 1-2 | EXAMPLE 1-3 |
|---|---|---|---|
| L (mm) | 795 | 745 | 625 |
| D (mm) | 3210 | 2110 | 910 |
| $\theta L$ (°) | 0.243 | 0.339 | 0.602 |
| d (μm) | 100 | 100 | 100 |
| ns | 1.5 | 1.5 | 1.5 |
| $2d \times \tan(\arcsin(\sin\theta L / ns))$ | 32.5 | 45.5 | 81.5 |

FIG. 10

| | EXAMPLE 2-1 | EXAMPLE 2-2 | EXAMPLE 2-3 |
|---|---|---|---|
| L(mm) | 795 | 745 | 625 |
| D(mm) | 3210 | 2110 | 910 |
| $\theta L(°)$ | 0.243 | 0.339 | 0.602 |
| d($\mu$m) | 20 | 20 | 20 |
| ns | 1.6 | 1.6 | 1.6 |
| $2d \times \tan(\arcsin(\sin\theta L/ns))$ | 6.1 | 8.5 | 15.1 |

_US 11,335,890 B2_

LIGHT-EMITTING DEVICE AND LIGHT-EMITTING SYSTEM

CROSS-REFERENCE TO RELATED APPLICATIONS

This application is a U.S. National Stage entry of PCT Application No: PCT/JP2017/044464 filed Dec. 12, 2017, which claims priority to Japanese Patent Application No. 2016-245789, filed Dec. 19, 2016, the contents of which are incorporated herein by reference.

TECHNICAL FIELD

The present invention relates to a light-emitting device and a light-emitting system.

BACKGROUND ART

In recent years, organic light-emitting diodes (OLEDs) have been developed as light-emitting devices. An OLED includes an organic layer, and this organic layer includes a light-emitting layer which emits light by organic electro luminescence. The OLED further includes a first electrode (for example, an anode electrode) and a second electrode (for example, a cathode electrode). The first electrode and the second electrode face each other with the organic layer interposed therebetween. In the OLED, light is emitted by applying voltage to the organic layer using the first electrode and the second electrode.

Patent Document 1 describes an example of an OLED. This OLED includes a plurality of light-emitting units and a plurality of light-transmitting units, and the plurality of light-emitting units and the plurality of light-transmitting units are alternately aligned. Each of the plurality of light-emitting units includes a laminated structure of the first electrode, the organic layer, and the second electrode. The second electrode functions as a light shielding unit. The light-transmitting unit is not overlapped with the second electrode; therefore, light from outside can be transmitted through the light-transmitting unit.

RELATED ART DOCUMENTS

Patent Documents

[Patent Document 1]: Japanese Unexamined Patent Application Publication No. 2013-200964

SUMMARY OF THE INVENTION

In recent years, for example, as described in Patent Document 1, OLEDs having a light-emitting unit and a light-transmitting unit have been developed. In such OLEDs, the light-emitting unit may be provided on a first surface side of a substrate. In such a case, light from the light-emitting unit may leak out from the first surface side of the substrate. Depending on the purpose of usage of the OLED, it may be required to prevent light from leaking from a light-emitting unit which is located in an oblique direction when viewed from a certain location facing the first surface toward the location.

An example of the problem to be solved by the present invention is to prevent light from leaking, from a light-emitting unit which is located in an oblique direction when viewed from a certain location facing a first surface toward the location when the light-emitting unit is provided on a first surface side of a substrate in an OLED having a light-emitting unit and a light-transmitting unit.

Means for Solving the Problem

The invention described in claim 1 is a light-emitting device including:
a plurality of light-emitting units located on a first surface side of a substrate having a thickness d and a refractive index ns, each light-emitting unit having a light shielding layer; and
a light-transmitting unit located between the plurality of light-emitting units,
in which the plurality of light-emitting units include a first light-emitting unit located the farthest from a first location, and
in which when an angle between a perpendicular line from the first location to the substrate and the first light-emitting unit is an angle $\theta L$,
an end of the light shielding layer of the first light-emitting unit on the first location side is located outside an end of the first light-emitting unit on the first location side by equal to or greater than $d \times \tan(\arcsin(\sin \theta L/ns))$ and equal to or less than $3d \times \tan(\arcsin(\sin \theta L/ns))$.

The invention described in claim 6 is a light-emitting device including:
a plurality of light-emitting units located on a first surface side of a substrate having a first side and a second side opposing each other, each light-emitting unit including a light shielding layer; and
a light-transmitting unit located between the plurality of light-emitting units adjacent to each other,
in which the plurality of light-emitting units include a first light-emitting unit out of the plurality of light-emitting units which is the closest to the first side,
in which an end of the light shielding layer of the first light-emitting unit on the second side is located outside an end of the first light-emitting unit by a first distance, and
in which the first distance is:
equal to or greater than 30.8 μm and equal to or less than 256.7 μm when a thickness of the substrate is equal to or greater than 100 μm and equal to or less than 300 μm and a refractive index thereof is 1.5; or
equal to or greater than 2.9 μm and equal to or less than 39.6 μm when the thickness of the substrate is equal to or greater than 10 μm and equal to or less than 50 μm and the refractive index thereof is 1.6.

The invention described in claim 7 is a light-emitting device including:
a plurality of light-emitting units located on a first surface side of a substrate having a first side and a second side opposing each other, each light-emitting unit including a light shielding layer; and
a light-transmitting unit located between the plurality of light-emitting units adjacent to each other,
in which the plurality of light-emitting units include a first light-emitting unit out of the plurality of light-emitting units which is the closest to the first side,
in which an end of the light shielding layer of the first light-emitting unit on the second side is located outside an end of the first light-emitting unit by a first distance, and
in which the first distance is:
equal to or greater than 5.8 μm and equal to or less than 6.4 μm;

equal to or greater than 8.1 μm and equal to or less than 8.9 μm;

equal to or greater than 14.4 μm and equal to or less than 15.9 μm;

equal to or greater than 30.8 μm and equal to or less than 34.1 μm;

equal to or greater than 43.3 μm and equal to or less than 47.8 μm, or equal to or greater than 77.4 μm and equal to or less than 85.6 μm.

The invention described in claim 8 is a light-emitting system including:

a first location; and a light-emitting device, in which the light-emitting device includes:

a plurality of light-emitting units located on a first surface side of a substrate having a thickness d and a refractive index ns, each light-emitting unit including a light shielding layer; and a light-transmitting unit located between the plurality of light-emitting units adjacent to each other, in which the plurality of light-emitting units include a first light-emitting unit located the farthest from a first location, and in which when an angle between a perpendicular line from the first location to the substrate and the first light-emitting unit is an angle θL, an end of the light shielding layer of the first light-emitting unit on the first location side is located outside an end of the first light-emitting unit by equal to or greater than d×tan(arcsin(sin θL/ns)) and equal to or less than 3d×tan(arcsin(sin θL/ns)).

BRIEF DESCRIPTION OF THE DRAWINGS

The objects described above, and other objects, features and advantages are further made apparent by suitable embodiments that will be described below and the following accompanying diagrams.

FIG. 9 is a table to explain an example of utilizing the light-emitting system shown in FIG. 1 in an automobile.

FIG. 10 is a table to explain an example of utilizing the light-emitting system shown in FIG. 1 in an automobile.

DESCRIPTION OF EMBODIMENT

Figure 1:
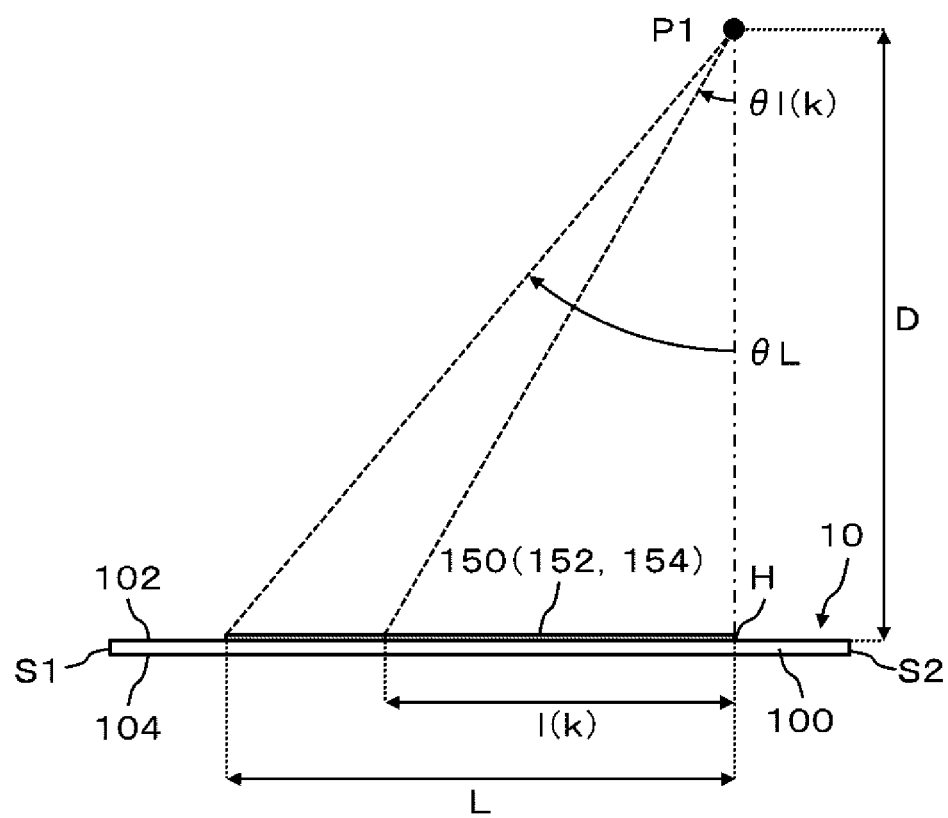
FIG. 1 is a plan view of a light-emitting device according a first embodiment.

Embodiments of the present invention will be described below by referring to the drawings. Moreover, in all the drawings, the same constituent elements are given the same reference numerals, and descriptions thereof will not be repeated.

First Embodiment

Figure 2:
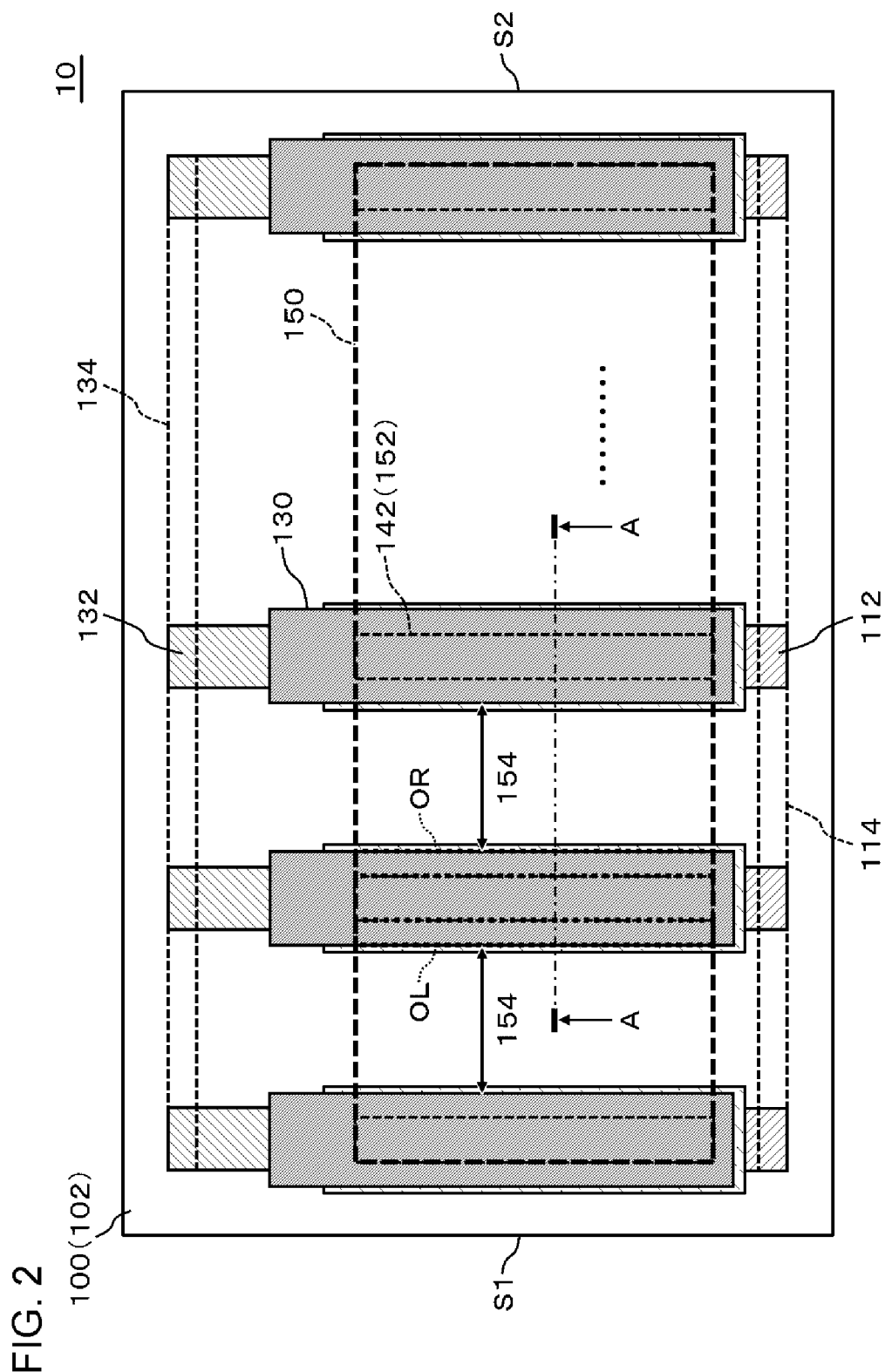
FIG. 2 is a plan view of a light-emitting device shown in FIG. 1.
Figure 3:
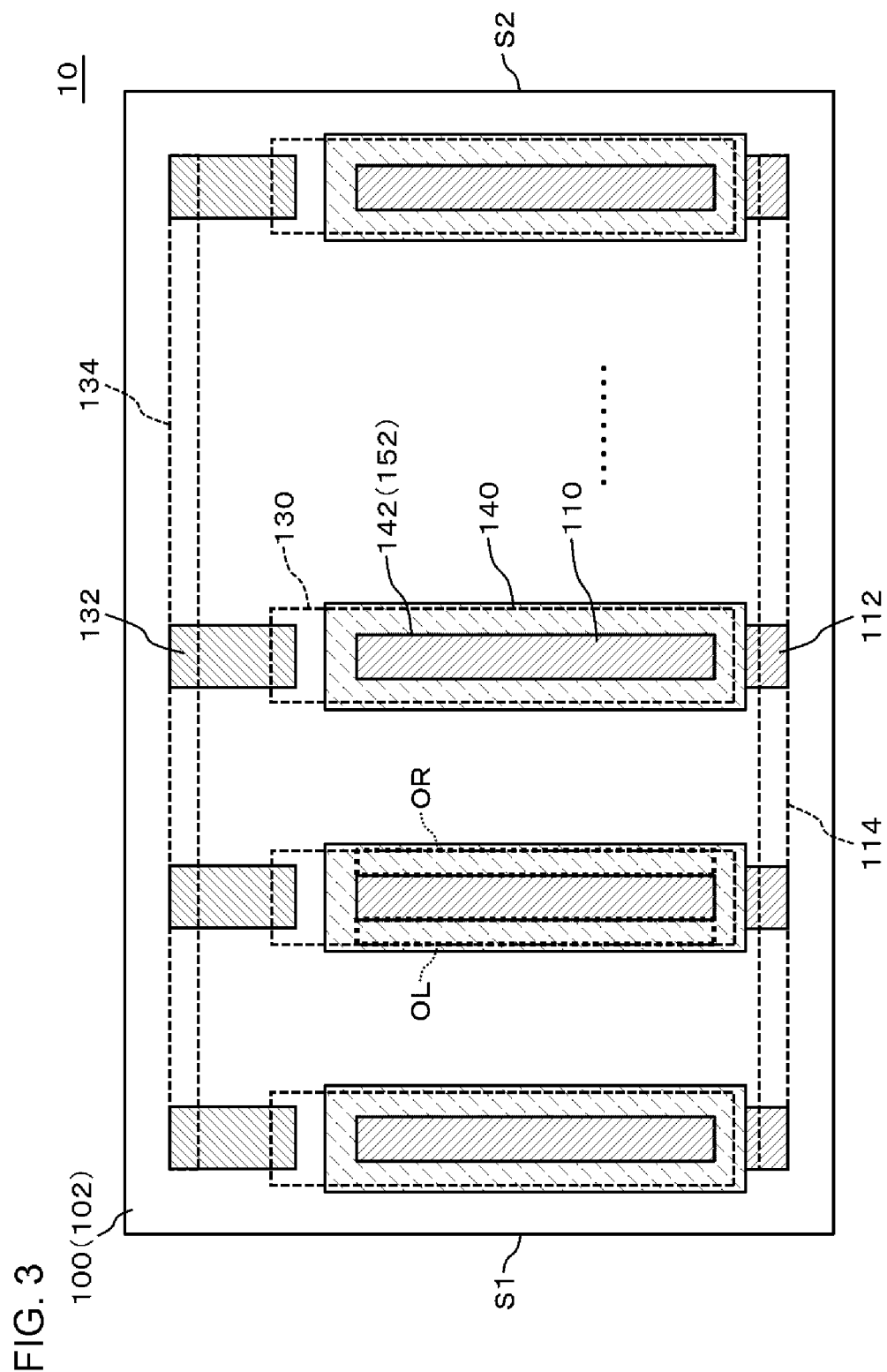
FIG. 3 is a diagram in which a plurality of second electrodes are removed from FIG. 2.
Figure 4:
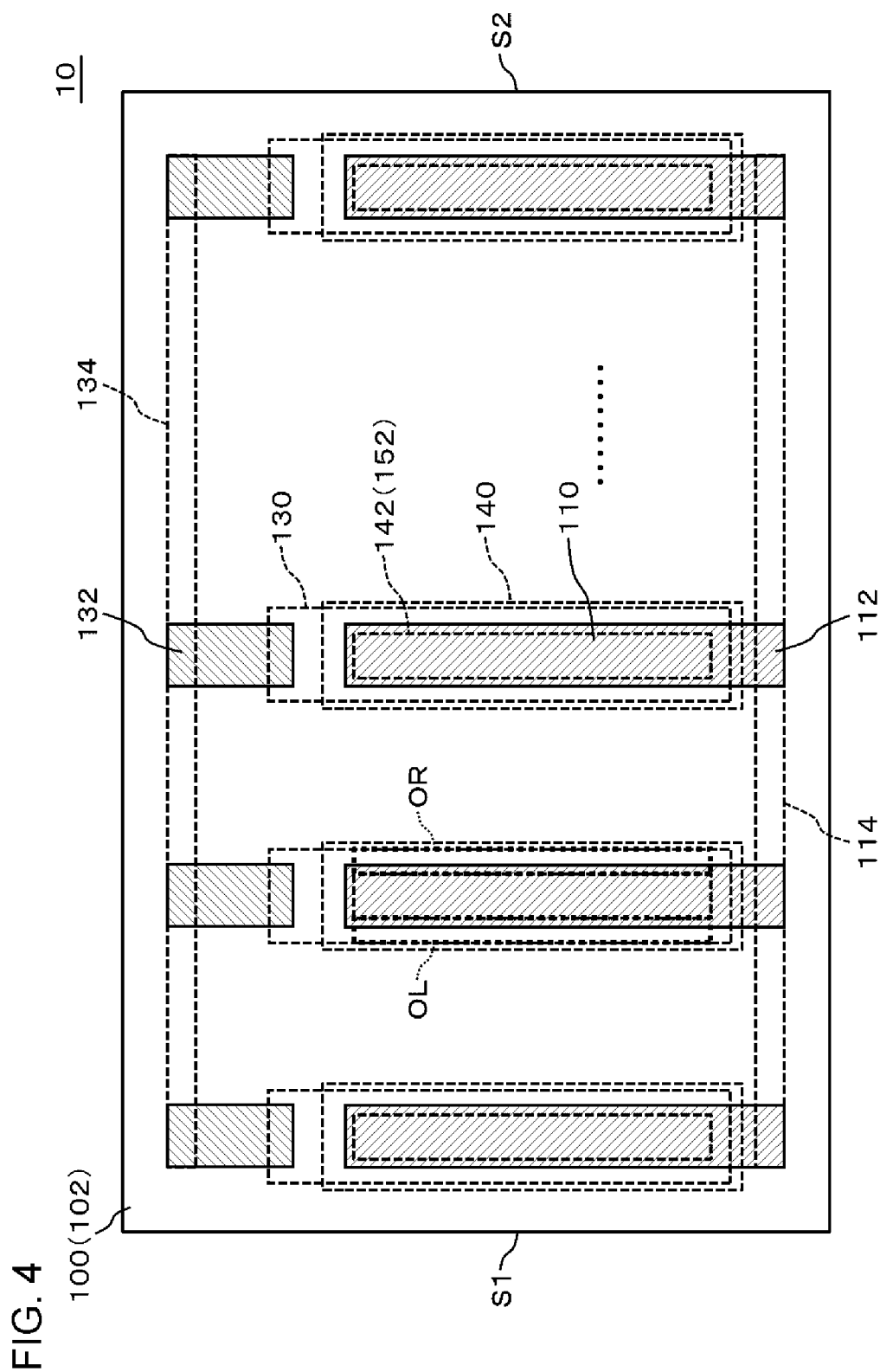
FIG. 4 is a diagram in which a plurality of insulating layers are removed from FIG. 3.
Figure 5:
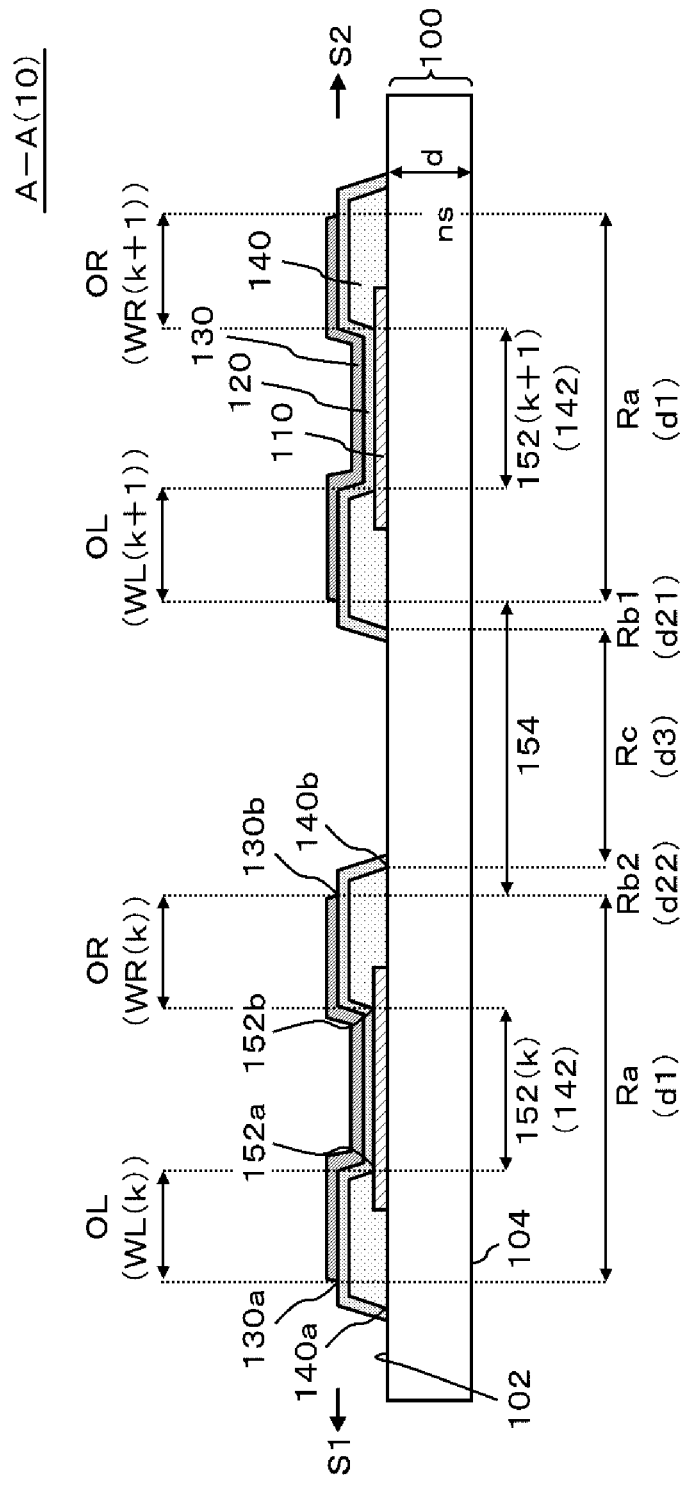
FIG. 5 is a cross-sectional view taken along line A-A of FIG. 2.

FIG. 1 is a diagram of a light-emitting system 20 according to the first embodiment. FIG. 2 is a plan view of a light-emitting device 10 shown in FIG. 1. FIG. 3 is a diagram in which a plurality of second electrodes 130 are removed from FIG. 2. FIG. 4 is a diagram in which a plurality of insulating layers 140 are removed from FIG. 3. FIG. 5 is a cross-sectional view taken along line A-A of FIG. 2. Meanwhile, the organic layer 120 (FIG. 5) is not shown in FIGS. 2-4 for ease of explanation.

A summary of the light-emitting system 20 is explained using FIG. 1 and FIG. 5. The light-emitting system 20 includes a first location P1 and the light-emitting device 10. The light-emitting device 10 includes a light-emitting region 150. The light-emitting region 150 includes a plurality of light-emitting units 152 and a plurality of light-transmitting units 154. The plurality of light-emitting units 152 are located on a substrate 100 on the first surface 102 side. The substrate 100 has a first side S1 and a second side S2. The first side S1 and the second side S2 exist opposing each other. In addition, the substrate 100 has a thickness d and a refractive index ns. Each of the plurality of light-emitting units 152 includes a laminating structure of a first electrode 110, an organic layer 120, and a second electrode 130 laminated in this order. The second electrode 130 has light shielding properties, in other words, the second electrode 130 functions as a light shielding layer. Each of the plurality of light-transmitting units 154 is located between light-emitting units 152 adjacent to each other, in other words, the plurality of light-emitting units 152 and the plurality of light-transmitting units 154 are alternately aligned. In the example shown in the diagram, a perpendicular line from the first location P1 to the first surface 102 of the substrate 100 intersects the first surface 102 of the substrate 100 at a location H, and the light-emitting region 150 spreads from the location H toward the first side S1. The first location P1 is apart from the location H by a distance D. The plurality of light-emitting units 152 include a k-th light-emitting unit 152(k) at the k-th unit from the first side S1 of the substrate 100. The k-th light-emitting unit 152(k) exists in a direction of an angle θl(k) when viewed from the first location P1. In other words, the k-th light-emitting unit 152(k) exists at a location apart from the location H by a distance l(k), and θl(k)=arctan(l(k)/D). Particularly, the angle θL is an angle between the perpendicular line from the first location P1 to the location H and the light-emitting unit 152 (a first light-emitting unit) located the farthest from the first location P1. More specifically, as later described in FIG. 7, the angle θL (θl(k) in the example of FIG. 7) is an angle between the perpendicular line from the first location P1 to the substrate 100 and an end (an end 152a) of the first light-emitting unit on the opposite side of the first location P1 side.

An end (that is, an end 130b) of the second electrode 130 of the k-th light-emitting unit 152(k) on the first location P1 side (that is, the second side S2) exists on the outer side of an end (an end 152b) of the k-th light-emitting unit 152(k) on the first location P1 side by a certain distance (corresponds to a width WR(k) of an overlapping region OR to be described later). In one example, the width WR(k) is equal to or greater than d×tan(arcsin(sin θl(k)/ns)) and equal to or less than 3d×tan(arcsin(sin θl(k)/ns)) (d×tan(arcsin(sin θl(k)/ns))≤WR(k)≤3d×tan(arcsin(sin θl(k)/ns))).

In a case where the width WR(k) is equal to or greater than d×tan(arcsin(sin θl(k)/ns)), light can be prevented from leaking from the k-th light-emitting unit 152(k) toward the first location P1. On the other hand, in a case where the width WR(k) is equal to or less than 3d×tan(arcsin(sin θl(k)/ns)), it is possible to prevent the width of the light-transmitting unit 154 adjacent to the end 152b of the k-th light-emitting unit 152(k) from narrowing, in other words, it is possible to maintain high light transmittance of the light-emitting device 10.

Particularly, with respect to the light-emitting unit 152 (the first light-emitting unit) located the farthest from the first location P1, the width WR(k) can be defined as, in one example, equal to or greater than d×tan(arcsin(sin θL/ns)) and equal to or less than 3d×tan(arcsin(sin θL/ns)) (d×tan(arcsin(sin θL/ns))≤WR(k)≤3d×tan(arcsin(sin θL/ns))). The angle θL is θL=arctan(L/D). A distance L is a distance between the location H and the first light-emitting unit.

Regarding the light-emitting unit 152 (the first light-emitting unit) which is the farthest from the first location P1, in a case where the width WR(k) is equal to or greater than d×tan(arcsin(sin θL/ns), light can be prevented from leaking from the first light-emitting unit toward the first location P1. Particularly, since the first light-emitting unit, out of the plurality of light-emitting units 152, exists the farthest from the first location P1, in a case where the later described overlapping region OR is not provided, the possibility of light leakage toward the first location becomes the highest. In the above-mentioned configuration, such light leakage from the first light-emitting unit can be prevented from occurring with high reliability. On the other hand, with respect to the first light-emitting unit, in a case where the width WR(k) is equal to or less than 3d×tan(arcsin(sin θL/ns)), it is possible to prevent the width of the light-transmitting unit 154 adjacent to the end 152b of the first light-emitting unit from narrowing, in other words, it is possible to maintain high light transmittance of the light-emitting device 10.

Further, with respect to any light-emitting unit 152, the width WR(k) may be equal to or greater than d×tan(arcsin (sin θL/ns)) and equal to or less than 3d×tan(arcsin(sin θL/ns)) (d×tan(arcsin(sin θL/ns))≤WR(k)≤3d×tan(arcsin(sin θL/ns))). In this case, leakage of light toward the first location P1 can be prevented not only from the light-emitting unit 152 (the first light-emitting unit) which is the farthest from the first location P1 but also from other light-emitting units 152.

In one example, the light-emitting system 20 is used in an automobile. In this example, the first location P1 is the driver's seat, and the light-emitting device 10 is installed on a rear portion of the automobile, more specifically, the rear window. The light-emitting device 10 spreads across the rear portion of the automobile (the rear window) from the driver's seat (the first location P1) side to the opposite side (that is, the passenger seat side) of the driver's seat (the first location P1). In this example, the light-emitting device 10 functions as a high-mount stop-lamp. Light from the light-emitting device 10 is mainly outputted to a second surface 104 (an opposite side of the first surface 102) side of the substrate 100, that is, to the outside of the automobile. In the example shown in FIG. 1, light from the light-emitting device 10 is prevented from leaking toward the first location P1 (the driver's seat).

Meanwhile, in FIG. 1, the light-emitting system 20 is viewed from a direction perpendicular to a plane including the first location P1 and the plurality of light-emitting units 152. In other words, light which leaks from each light-emitting unit 152 toward the first location P1 leaks along the plane. Therefore, a perpendicular line from the first location P1 to the location H is a perpendicular line in a case where the light-emitting system 20 is viewed from the aforementioned direction. In one example, in a case where the light-emitting system 20 is utilized in an automobile, in FIG. 1, the light-emitting system 20 is viewed from above the automobile.

Next, details of a plan layout of the light-emitting device 10 is described using FIGS. 2-4. The light-emitting device 10 includes a substrate 100, a plurality of first electrodes 110, a plurality of first connection portions 112, a first wiring 114, a plurality of second electrodes 130, a plurality of second connection portions 132, a second wiring 134, and a plurality of insulating layers 140.

The shape of the substrate 100 is, when viewed from a direction perpendicular to the first surface 102, a rectangle having a pair of long sides and a pair of short sides. However, the shape of the substrate 100 is not limited to the example shown in the diagram. The shape of the substrate 100 may be, when viewed from a direction perpendicular to the first surface 102, for example, a circle or a polygon other than a rectangle.

The plurality of first electrodes 110 are located separated from each other, and specifically, are aligned in a row along the long side of the substrate 100. Each of the plurality of first electrodes 110 extends along the short side of the substrate 100.

Each of the plurality of first electrodes 110 are connected to the first wiring 114 through a respective one of the plurality of first connection portions 112. The plurality of first connection portions 112 are connected to each other through the first wiring 114. The first wiring 114 extends along one of a pair of long sides of the substrate 100. Voltage from the outside is supplied to the first electrode 110 through the first wiring 114 and the first connection portions 112. Meanwhile, in the example shown in the diagram, the first electrode 110 and the first connection portion 112 are integral with each other. In other words, the light-emitting device 10 includes a conductive layer having a region which functions as the first electrode 110 and a region which functions as the first connection portion 112.

Each of the plurality of second electrodes 130 overlaps a respective one of the plurality of first electrodes 110. The plurality of second electrodes 130 are located separated from each other, and specifically, are aligned in a row along the long side of the substrate 100. Each of the plurality of second electrodes 130 extends along the short side of the substrate 100, and specifically, each of the plurality of second electrodes 130 has a pair of long sides which extends along the short side of the substrate 100 and a pair of short sides which extends along the long side of the substrate 100.

Each of the plurality of second electrodes 130 is connected to the second wiring 134 through a respective one of the plurality of second connection portions 132. The plurality of second connection portions 132 are connected to each other through the second wiring 134. The second wiring 134 extends along the other of the pair of long sides of the substrate 100. Voltage from the outside is supplied to the second electrode 130 through the second wiring 134 and the second connection portion 132.

Each of the plurality of insulating layers 140 overlaps a respective one of the plurality of first electrodes 110. The plurality of insulating layers 140 are located separated from each other, and specifically, are aligned in a row along the long side of the substrate 100. Each of the plurality of insulating layers 140 extends along the short side of the substrate 100, and specifically, each of the plurality of insulating layers 140 has a pair of long sides which extends along the short side of the substrate 100 and a pair of short sides which extends along the long side of the substrate 100.

Each of the plurality of insulating layers 140 has an opening 142. As described later using FIG. 5, inside the opening 142, the first electrode 110, the organic layer 120, and the second electrode 130 include a region (a laminated structure of the first electrodes 110, the organic layer 120, and the second electrode 130) which functions as the light-emitting unit 152. In other words, the insulating layer 140 defines the light-emitting unit 152. The light-emitting unit 152 (the opening 142) extends along the short side of the substrate 100, and specifically, the light-emitting unit 152 has a pair of long sides which extends along the short side of the substrate 100 and a pair of short sides which extends along the long side of the substrate 100.

The light-emitting device 10 includes the light-emitting region 150. The light-emitting region 150 includes the plurality of light-emitting units 152 and the plurality of light-transmitting units 154 which are alternately aligned. In the example shown in the diagram, the shape of the light-emitting region 150 is a rectangle having a pair of long sides and a pair of short sides.

The light-emitting device 10 has an overlapping region OL and the overlapping region OR. The overlapping region OL and the overlapping region OR are located on the opposite side of each other with the light-emitting unit 152 interposed therebetween. The overlapping region OL is deviated from the light-emitting unit 152 to the first side S1 and is overlapped with the second electrode 130. The overlapping region OR is deviated from the light-emitting unit 152 to the second side S2 and is overlapped with the second electrode 130.

Next, details of a cross section of the light-emitting device 10 is described using FIG. 5. The light-emitting device 10 includes the substrate 100 (a first substrate), the first electrode 110, the organic layer 120, the second electrode 130, and the insulating layer 140. The substrate 100 has the first surface 102 and the second surface 104. The second surface 104 exists on the opposite side of the first surface 102. Each of the first electrode 110, the organic layer 120, the second electrode 130, and the insulating layer 140 is on the first surface 102 of the substrate 100.

The substrate 100 has optical transparency. In one example, the substrate 100 includes glass. In another example, the substrate 100 may include resin. In a case where the substrate 100 includes resin, either or both of the first surface 102 and the second surface 104 of the substrate 100 are coated by an inorganic barrier layer (for example, $SiN_x$, SiON, or $Al_2O_3$). This inorganic layer functions as a moisture-proof film.

The first electrode 110 has optical transparency and conductivity. Specifically, the first electrode 110 includes a material having optical transparency and conductivity, for example, a metal oxide, and specifically for example, at least one of indium tin oxide (ITO) and indium zinc oxide (IZO). Thereby, light from the organic layer 120 can be transmitted through the first electrode 110.

The organic layer 120 includes, for example, a hole injection layer, a hole transport layer, a light-emitting layer, an electron transport layer, and an electron injection layer. The hole injection layer and the hole transport layer are connected to the first electrode 110. The electron transport layer and the electron injection layer are connected to the second electrode 130. The light-emitting layer emits light by voltage between the first electrode 110 and the second electrode 130.

In the example shown in the diagram, the organic layer 120 spreads toward the outside of the opening 142 of the insulating layer 140, and in addition, the organic layer 120 spreads toward the outside of an end of the insulating layer 140. In this manner, the organic layer 120 covers the insulating layer 140. In another example, the organic layer 120 need not spread to the outside of the end of the insulating layer 140.

The second electrode 130 has light reflectivity and conductivity. Specifically, the second electrode 130 includes a material having light reflectivity, for example, a metal, and specifically for example, at least one of Al, Ag, and MgAg. Thereby, light from the organic layer 120 is hardly transmitted through the second electrode 130 and reflected on the second electrode 130.

Meanwhile, due to the light reflectivity of the second electrode 130, the second electrode 130 has light shielding properties. Therefore, in the example shown in the diagram, light from the organic layer 120 is inhibited from leaking from the second electrode 130.

The insulating layer 140 has optical transparency. In one example, the insulating layer 140 includes an organic insulating material, for example, a polyimide. In another example, the insulating layer 140 may include an inorganic insulating material, and specifically for example, a silicon oxide ($SiO_x$), a silicon oxynitride (SiON), or a silicon nitride ($SiN_x$). Meanwhile, the insulating layer 140 need not have optical transparency and may have light shielding properties.

The insulating layer 140 includes the opening 142. The insulating layer 140 exposes a portion of the first electrode 110 from the opening 142 and covers an end of the first electrode 110. In this manner, the insulating layer 140 defines the light-emitting unit 152, and prevents the end of the first electrode 110 from contacting the second electrode 130.

In the example shown in the diagram, a side face of the insulating layer 140 is inclined. More specifically, the side face of the insulating layer 140 is further inclined inward of the insulating layer 140 from a lower end toward an upper end of the insulating layer 140.

Meanwhile, the light-emitting device 10 may include a conductive portion (a bus line). The conductive portion includes a material having higher conductivity than a material of the first electrode 110, thereby, the conductive portion can function as an auxiliary electrode of the first electrode 110. In one example, the conductive portion is MAM (Mo/Al/Mo). The conductive portion may be overlapped with the insulating layer 140 on the first electrode 110, or may be overlapped with the first electrode 110 on the first surface 102 of the substrate 100.

In the example shown in the diagram, the second electrode 130 includes an end 130a and an end 130b, and the insulating layer 140 includes an end 140a and an end 140b. The light-emitting unit 152 includes an end 152a and an end 152b. The end 130a, the end 140a, and the end 152a face the first side S1 of the substrate 100. The end 130b, the end 140b, and the end 152b face the second side S2 of the substrate 100 and exist on the opposite side of the end 130a, the end 140a, and the end 152a, respectively.

The light-emitting device 10 has the overlapping region OL and the overlapping region OR. The overlapping region OL spreads from the end 152a of the light-emitting unit 152 to the end 130a of the second electrode 130 in a direction from the second side S2 to the first side S1. In other words, in the overlapping region OL, the end 130a of the second electrode 130 exists on the outer side of the end 152a of the light-emitting unit 152 by the width WL(k) of the overlapping region OL. The overlapping region OR spreads from the end 152b of the light-emitting unit 152 to the end 130b of the second electrode 130 in a direction from the first side S1 to the second side S2. In other words, in the overlapping region OR, the end 130b of the second electrode 130 exists on the outside of the end 152b of the light-emitting unit 152 by the width WR(k) of the overlapping region OR.

Meanwhile, in the example shown in the diagram, the width WL(k) and the width WR(k) are the same as each other.

In any of the overlapping region OL and the overlapping region OR, the second electrode 130 (that is, the light shielding layer) is located above the first surface 102 of the substrate 100. Therefore, in the overlapping region OL and the overlapping region OR, even when light leaks from the first surface 102 of the substrate 100, most of the light is shielded by the second electrode 130.

The first surface 102 of the substrate 100 includes a plurality of regions Ra, a plurality of regions Rb1, a plurality of regions Rb2, and a plurality of regions Rc. Each of the plurality of regions Ra spreads from a location overlapped with the end 130a to a location overlapped with the end 130b of the second electrode 130. Each of the plurality of regions Rb1 spreads from a location overlapped with the end 130a of the second electrode 130 to a location overlapped with the end 140a of the insulating layer 140. Each of the plurality of regions Rb2 spreads from a location overlapped with the end 130b of the second electrode 130 to a location overlapped with the end 140b of the insulating layer 140. Each of the plurality of regions Rc spreads from a location overlapped with the end 140a of one insulating layer 140 out of two insulating layers 140 adjacent to each other to a location overlapped with the end 140b of the other insulating layer 140.

A region Ra overlaps the second electrode 130. Therefore, the light-emitting device 10 has the lowest light transmittance in a region overlapped with the region Ra out of regions which are overlapped with the region Ra, a region Rb1, a region Rb2, and the region Rc. The region Rc is overlapped neither with the second electrode 130 nor the insulating layer 140. Therefore, the light-emitting device 10 has the highest light transmittance in a region overlapped with the region Rc out of regions which are overlapped with the region Ra, the region Rb1, the region Rb2, and the region Rc. The region Rb1 is not overlapped with the second electrode 130 but overlapped with the insulating layer 140. Therefore, the light-emitting device 10 has higher light transmittance in a region overlapped with the region Rb1 than that in a region overlapped with the region Ra and lower light transmittance than that in the region overlapped with the region Rc. As is the case with the above, the region Rb2 is not overlapped with the second electrode 130 but overlapped with the insulating layer 140. Therefore, the light-emitting device 10 has higher light transmittance in a region overlapped with the region Rb2 than that in the region overlapped with the region Ra and lower light transmittance than that in the region overlapped with the region Rc.

Meanwhile, the first surface 102 of the substrate 100 need not have the region Rb1. In other words, the end 130a of the second electrode 130 may be located on the outside of the end 140a of the insulating layer 140, and further, the end 130a of the second electrode 130 may be in contact with the first surface 102 of the substrate 100 on the outside of the end 140a of the insulating layer 140. As is the case with the above, the first surface 102 of the substrate 100 need not have the region Rb2. In other words, the end 130b of the second electrode 130 may be located on the outside of the end 140b of the insulating layer 140, and further, the end 130b of the second electrode 130 may be in contact with the first surface 102 of the substrate 100 on the outside of the end 140b of the insulating layer 140.

In the example shown in the diagram, the light transmittance of the light-emitting device 10 as a whole is high. In detail, in the example shown in the diagram, the width of a region having high light transmittance, that is, the width d3 of the region Rc is wide. Specifically, the width d3 of the region Rc is wider than the width d21 of the region Rb1 (d3>d21), and further, the width d3 of the region Rc is wider than the width d22 of the region Rb2 (d3>d22). Thus, the light transmittance of the light-emitting device 10 as a whole is high.

In the example shown in the diagram, the light-emitting device 10 is prevented from greatly absorbing light of a specific wavelength. In detail, in the example shown in the diagram, the width of a region of the insulating layer 140 where light passes through, that is, the width d21 of the region Rb1 is narrow, and specifically, the width d21 of the region Rb1 is narrower than the width d3 of regions Rc (d21<d3). As is the case with the above, the width of a region of the insulating layer 140 where light passes through, that is, the width d22 of the region Rb2 is narrow, and specifically, the width d22 of the region Rb2 is narrower than the width d3 of regions Rc (d22<d3). The insulating layer 140 may absorb light of a specific wavelength. Even in such a case, in the example shown in the diagram, an amount of light passing through the insulating layer 140 is small. Thus, the light-emitting device 10 is prevented from greatly absorbing light of a specific wavelength.

Meanwhile, the width d3 of the region Rc may be wider than the width d1 of the region Ra (d3>d1), may be narrower than the width d1 of the region Ra (d3<d1), or may be the same as the width d1 of the region Ra (d3=d1).

In one example, the ratio d21/d1 of the width d21 of the region Rb1 to the width d1 of the region Ra is equal to or greater than 0 and equal to or less than 0.2 (0≤d21/d1≤0.2), the ratio d22/d1 of the width d22 of the region Rb2 to the width d1 of the region Ra is equal to or greater than 0 and equal to or less than 0.2 (0≤d22/d1≤0.2), and the ratio of d3/d1 of the width d3 of the region Rc to the width d1 of the region Ra is equal to or greater than 0.3 and equal to or less than 2 (0.3≤d3/d1≤2). More specifically, in one example, the width d1 of the region Ra is equal to or greater than 50 μm and equal to or less than 1,000 μm, the width d21 of the region Rb1 is equal to or greater than 0 μm and equal to or less than 200 μm, the width d22 of the region Rb2 is equal to or greater than 0 μm and equal to or less than 200 μm, and the width d3 of the region Rc is equal to or greater than 15 μm and equal to or less than 1,000 μm.

Meanwhile, the light-emitting region 150 is sealed by a sealing portion (not shown in the drawing). In one example, the sealing portion includes a sealing substrate and an adhesive layer. In this example, the sealing substrate is adhered to the first surface 102 of the substrate 100 through the adhesive layer. In another example, the sealing portion includes a glass can and a desiccant. In this example, the glass can covers the light-emitting region 150 and the desiccant is located not to overlap the light-emitting units 152. Further in another example, the sealing portion includes the inorganic layer formed by, for example, Atomic Layer Deposition (ALD), Chemical Vapor Deposition (CVD), sputtering, vapor deposition, or coating. The inorganic layer includes, for example, at least one selected from a group including, for example, $Al_2O_3$, $AlN_x$, $SiO_x$, $SiON$, $SiN_x$, $TiO_x$, $SiCN$, and $SiOC$.

In the example shown in the diagram, the light-emitting device 10 functions as a semi-transparent OLED. Specifically, a region which is not overlapped with the second electrode 130 functions as the light-transmitting unit 154. Thus, in the light-emitting device 10, the plurality of light-emitting units 152 and the plurality of light-transmitting units 154 are alternately aligned. In a case where no light is emitted from the plurality of light-emitting units 152, an object on the first surface 102 side is visible through from the second surface 104 side and an object on the second surface 104 side is visible through from the first surface 102 side to the human eye. In addition, light from the plurality of light-emitting units 152 is mainly outputted from the second surface 104 side, and is hardly outputted from the first surface 102 side. In a case where light is emitted from the plurality of light-emitting units 152, an object on the second surface 104 side is visible through from the first surface 102 side to the human eye.

Next, a method of manufacturing the light-emitting device 10 shown in FIGS. 2-5 will be described. The light-emitting device 10 is manufactured as a light-emitting device as follows.

First, the first electrode 110, the first connection portion 112, and the second connection portion 132 are formed on the first surface 102 of the substrate 100. In one example, the first electrode 110, the first connection portion 112, and the second connection portion 132 are formed by patterning the conductive layer formed by sputtering.

Next, the insulating layer 140 is formed. In one example, the insulating layer 140 is formed by patterning a photosensitive resin coated on the first surface 102 of the substrate 100.

Next, the organic layer 120 is formed. In one example, the organic layer 120 is formed by vapor deposition.

Next, the second electrode 130 is formed. In one example, the second electrode 130 is formed by vapor deposition.

In this manner, the light-emitting device 10 is manufactured.

Figure 6:
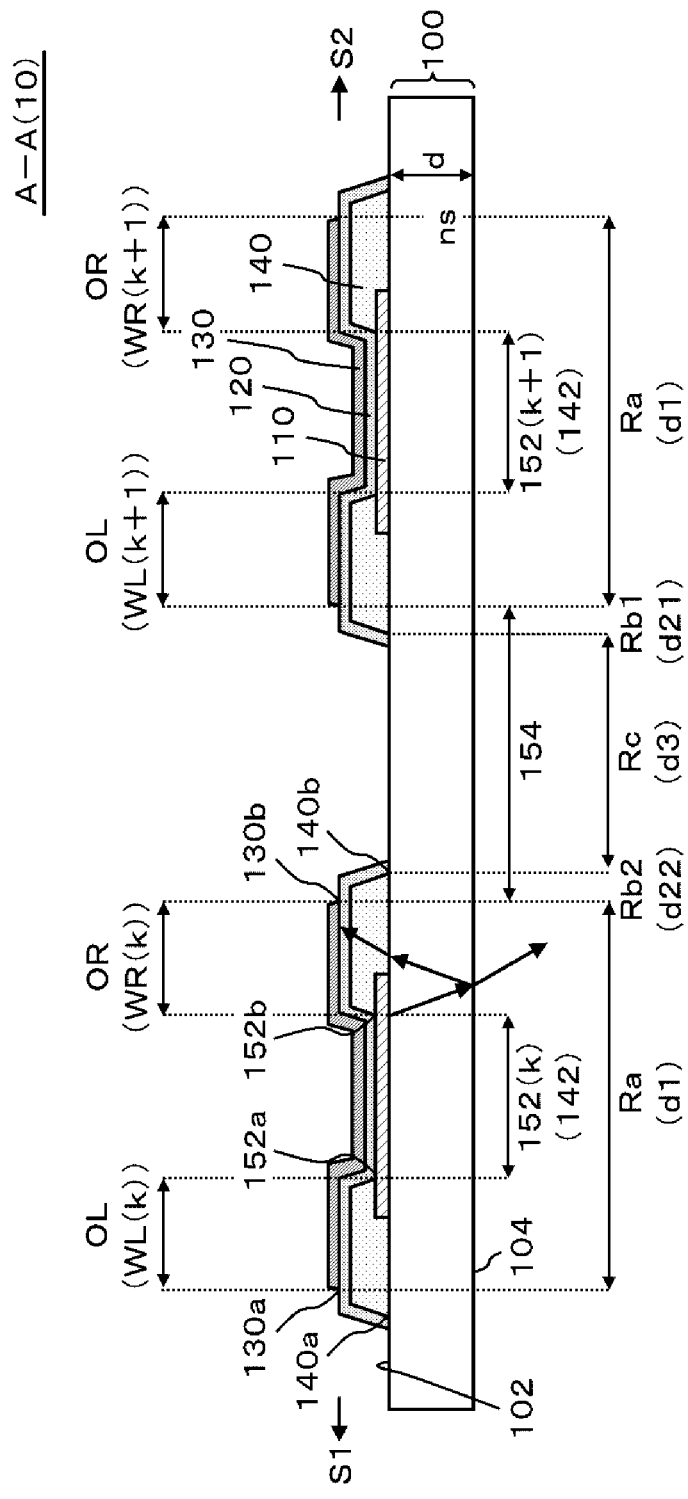
FIG. 6 is a diagram explaining an example of the operation of the light-emitting device shown in FIGS. 2-5.

FIG. 6 is a drawing explaining an example of the operation of the light-emitting device 10 shown in FIGS. 2-5. In the example shown in the diagram, light from the light-emitting unit 152 is transmitted through the substrate 100. Light reaches the second surface 104 of the substrate 100, a portion of the light is emitted from the second surface 104, and another portion of the light is reflected on the second surface 104. The light reflected on the second surface 104 is emitted from the first surface 102 of the substrate 100. Thus, even when light is emitted from the first surface 102, the light is shielded by the second electrode 130 (that is, the light shielding layer) in the overlapping region OR. In this manner, light can be prevented from leaking toward the first surface 102 side of the substrate 100.

Figure 7:
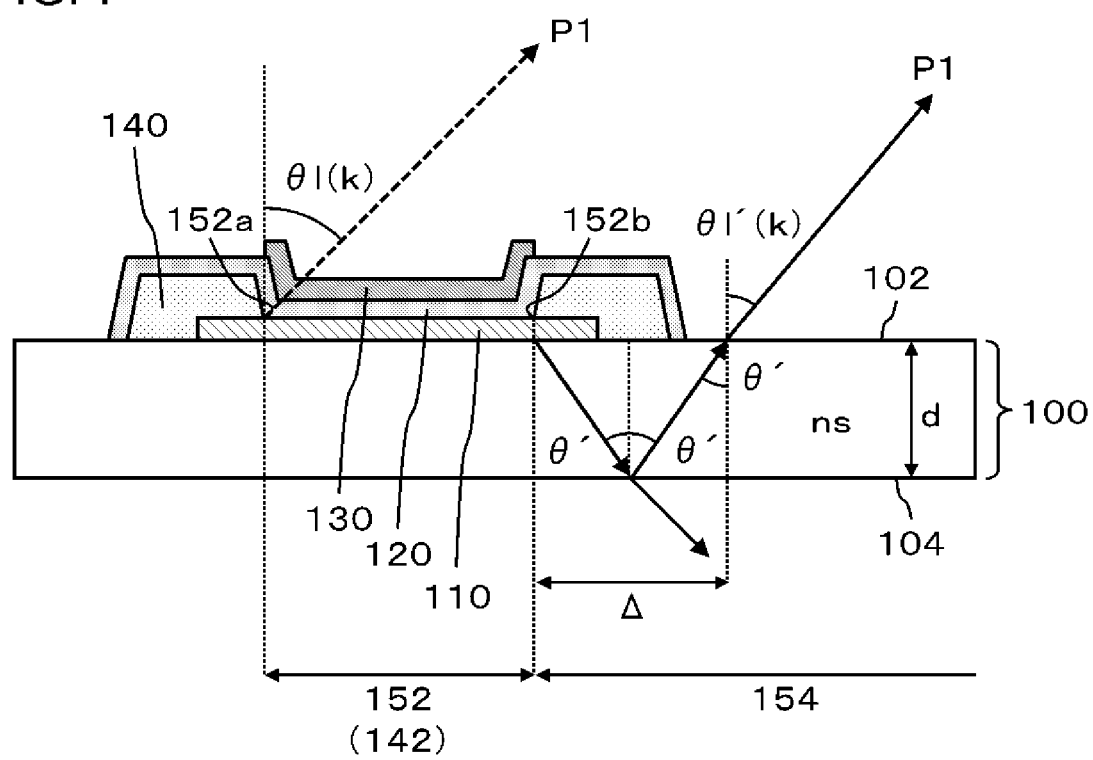
FIG. 7 is a diagram to explain the reason why light can be prevented from leaking toward a first location by the overlapping region shown in FIG. 5.

FIG. 7 is a drawing to explain the reason why light can be prevented from leaking toward the first location P1 shown in FIG. 1 by the overlapping region OR shown in FIG. 5. In the example shown in the diagram, both of the width of the overlapping region OR and the width of the overlapping region OL are substantially zero for ease of explanation. In addition, the first surface 102 of the substrate 100 is in contact with the air (a refractive index 1) on the outside of the first electrode 110, the organic layer 120, the second electrode 130, and the insulating layer 140.

In the example shown in the diagram, light from the light-emitting unit 152 is leaked toward the first location P1. Specifically, in the example shown in the diagram, light is emitted from immediately below the end 152b of the light-emitting unit 152. This light is reflected on the second surface 104 of the substrate 100 at an incident angle θ' and a reflection angle θ', and is incident on the first surface 102 of the substrate 100 at the incident angle θ'. This light is emitted from the first surface 102 of the substrate 100 at a refractive angle θl'(k) and heads toward the first location P1. In this case, the light is emitted from a location apart from the end 152b of the light-emitting unit 152 by a distance Δ in the width direction of the light-emitting unit 152.

In the example shown in the diagram, the distance Δ is 2d×tan(arcsin(sin θl'(k)/ns)) (Δ=2d×tan(arcsin(sin θl'(k)/ns))). Specifically, the distance Δ may be represented as 2d×tan θ' using the angle θ' (Δ=2d×tan θ'). In addition, on the interface between the first surface 102 of the substrate 100 and the air, ns×sin θ'=1×sin θl'(k) is established based on Snell's law. Using this formula, the distance Δ may be represented as 2d×tan(arcsin(sin θl'(k)/ns))).

As it is clear from the explanation above, in the example shown in FIG. 5, in a case where the end 130b of the second electrode 130 exists outside of the end 152b of the light-emitting unit 152 by a distance 2d×tan(arcsin(sin θl'(k)/ns)), (in other words, when the width WR(k) of the overlapping region OR is 2d×tan(arcsin(sin θl'(k)/ns))), it is possible to shield most of light leaked from the first surface 102 of the substrate 100 by the second electrode 130. In addition, since the angle θl(k) is larger than the angle θl'(k) (θl(k)>θl'(k)), in the example shown in FIG. 5, in a case where the end 130b of the second electrode 130 exists outside of the end 152b of the light-emitting unit 152 by a distance 2d×tan(arcsin(sin θl(k)/ns)), (in other words, when the width WR(k) of the overlapping region OR is 2d×tan(arcsin(sin θl(k)/ns))), it is possible to more positively shield most of the light leaked from the first surface 102 of the substrate 100 by the second electrode 130.

In addition, in the example shown in FIG. 1, with respect to any of the plurality of light-emitting units 152, in a case where the end 130b of the second electrode 130 exists outside of the end 152b of the light-emitting unit 152 by a distance 2d×tan(arcsin(sin θL/ns)), (in other words, when the width WR(k) of the overlapping region OR is 2d×tan (arcsin(sin θL/ns))), it is possible to shield most of the light leaked from the first surface 102 of the substrate 100 by the second electrode 130. Specifically, the angle θL is equal to or greater than the angle θl(k) for any integer k. Therefore, the distance 2d×tan(arcsin(sin θL/ns)) is equal to or greater than 2d×tan(arcsin(sin θl(k)/ns)) for any integer k. Therefore, it is possible to shield most of light leaked from the first surface 102 of the substrate 100 by the second electrode 130.

In the example shown in FIG. 5, the width of the overlapping region OR can be changed according to the purpose. In other words, the width of the overlapping region OR is not limited to 2d×tan(arcsin(sin θl'(k)/ns)), 2d×tan(arcsin(sin θl(k)/ns)), or 2d×tan(arcsin(sin θl(k)/ns)).

In one example, the width of the overlapping region OR may be d×tan(arcsin(sin θl(k)/ns)). In this example, it is possible to shield approximately half of light leaked from the first surface 102 by the second electrode 130.

In another example, the width of the overlapping region OR may be 3d×tan(arcsin(sin θl(k)/ns)). In this example, it is possible to positively shield substantially all of the light leaked from the first surface 102 by the second electrode 130 while maintaining high light transmittance of the light-emitting device 10.

In another example, the width of the overlapping region OR may be 2d×tan(arcsin(sin θl(k)/ns)). In this example, it is possible to shield substantially all of the light leaked from the first surface 102 by the second electrode 130 while maintaining higher light transmittance of the light-emitting device 10 than when the width of the overlapping region OR is 3d×tan(arcsin(sin θl(k)/ns)).

As such, in one example, the width of the overlapping region OR may be equal to or greater than d×tan(arcsin(sin θl(k)/ns)) and equal to or less than 3d×tan(arcsin(sin θl(k)/ns)). In another example, the width of the overlapping region OR may be equal to or greater than d×tan(arcsin(sin θl(k)/ns)) and equal to or less than 2d×tan(arcsin(sin θl(k)/ns)).

Figure 8:
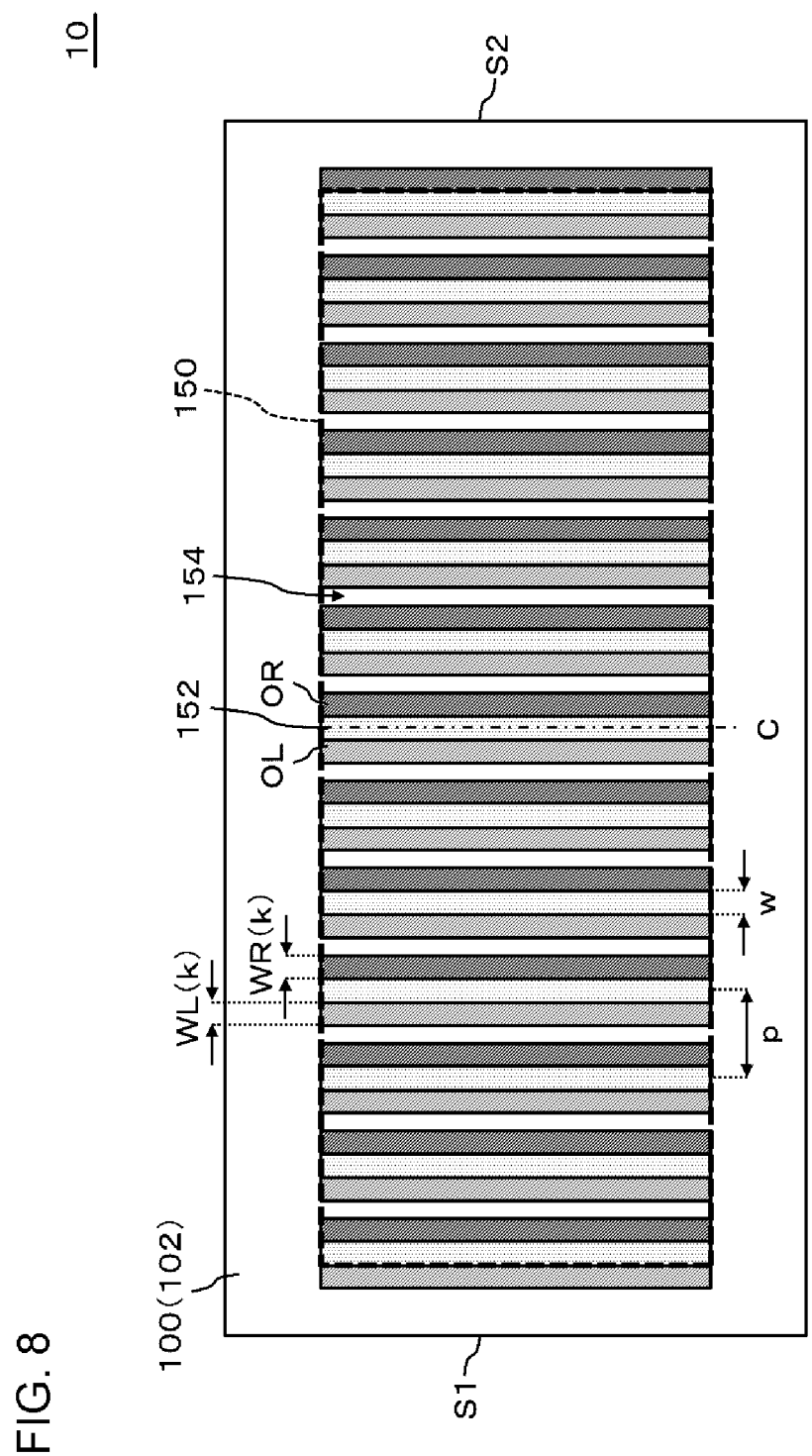
FIG. 8 is a diagram showing an example of the plan layout of the light-emitting unit and the overlapping region shown in FIG. 5.

FIG. 8 is a drawing showing an example of the plan layout of the light-emitting unit 152, the overlapping region OL, and the overlapping region OR shown in FIG. 5.

In the example shown in the diagram, for any integer k, the width WL(k) of the overlapping region OL and the width WR(k) of the overlapping region OR are the same as each other.

In the example shown in the diagram, the widths of a plurality of overlapping regions OL are the same as each other (WL(1)=WL(2)= . . . WL(k)= . . . ). Similarly, the widths of a plurality of overlapping regions OR are the same as each other (WR(1)=WR(2)= . . . =WR(k)= . . . ).

The brightness distribution of the light-emitting region 150 is substantially constant from the first side S1 to the second side S2. Specifically, the widths w of the plurality of light-emitting units 152 are the same as each other. In addition, a pitch p of the plurality of light-emitting units 152 (the distance between centers of light-emitting units 152 adjacent to each other) is constant from the first side S1 to the second side S2. Thus, the brightness distribution of the light-emitting region 150 is substantially constant from the first side S1 to the second side S2.

FIG. 9 and FIG. 10 are tables to explain n example of utilizing the light-emitting system 20 shown in FIG. 1 in an automobile. In the example shown in the tables, the light-emitting system 20 is used in an automobile having L=795 mm and D=3,210 mm (Example 1-1 and Example 2-1), an automobile having L=745 mm and D=2,110 mm (Example 1-2 and Example 2-2), and an automobile having L=625 mm and D=910 mm (Example 1-3 and Example 2-3). In addition, with respect to each of these three kinds of automobiles, a substrate 100 having d=100 μm and ns=1.5 (Example 1-1, Example 1-2, and Example 1-3), and a substrate 100 having d=20 μm and ns=1.6 (Example 2-1, Example 2-2, and Example 2-3) are used.

In Example 1-1, the distance 2d×tan(arcsin(sin θl(k)/ns)) is 32.5 μm. Therefore, when the width WR(1) of the overlapping region OR of a first light-emitting unit 152(1) (that is, the light-emitting unit 152 located closest to the first side S1 side out of the plurality of light-emitting units 152 in the example shown in FIG. 1) is the above-mentioned distance, light can be prevented from leaking from the first light-emitting unit 152(1) toward the first location P1. Meanwhile, the width WR(1) of the overlapping region OR of the first light-emitting unit 152(1) need not strictly match the above-mentioned distance, and may be equal to or greater than 95% and equal to or less than 105% of 2d×tan(arcsin(sin θl(k)/ns)), that is, equal to or greater than 30.8 μm and equal to or less than 34.1 μm.

In Example 1-2, the distance 2d×tan(arcsin(sin θl(k)/ns)) is 45.5 μm. Therefore, when the width WR(1) of the overlapping region OR of the first light-emitting unit 152(1) (that is, the light-emitting unit 152 located closest to the first side S1 out of the plurality of light-emitting units 152 in the example shown in FIG. 1) is the above-mentioned distance, light can be prevented from leaking from the first light-emitting unit 152(1) toward the first location P1. Meanwhile, the width WR(1) of the overlapping region OR of the first light-emitting unit 152(1) need not strictly match the above-mentioned distance, and may be equal to or greater than 95% and equal to or less than 105% of 2d×tan(arcsin(sin θl(k)/ns)), that is, equal to or greater than 43.3 μm and equal to or less than 47.8 μm.

In Example 1-3, the distance 2d×tan(arcsin(sin θl(k)/ns)) is 81.5 μm. Therefore, when the width WR(1) of the overlapping region OR of the first light-emitting unit 152(1) (that is, the light-emitting unit 152 located closest to the first side S1 out of the plurality of light-emitting units 152 in the example shown in FIG. 1) is the above-mentioned distance, light can be prevented from leaking from the first light-emitting unit 152(1) toward the first location P1. Meanwhile, the width WR(1) of the overlapping region OR of the first light-emitting unit 152(1) need not strictly match the above-mentioned distance, and may be equal to or greater than 95% and equal to or less than 105% of 2d×tan(arcsin(sin θl(k)/ns)), that is, equal to or greater than 77.4 μm and equal to or less than 85.6 μm.

From Example 1-1, Example 1-2, and Example 1-3, in one example, it may be said the width WR(1) of the overlapping region OR of the first light-emitting unit 152(1) may be equal to or greater than 30.8 μm and equal to or less than 256.7 μm when the thickness d of the substrate 100 is equal to or greater than 100 μm and equal to or less than 300 μm and the refractive index ns of the substrate 100 is 1.5. This numerical value range is a range between the minimum value of values that may be obtained from 2d×tan(arcsin(sin θl(k)/ns)) (that is, 95% of 32.5 μm: 30.8 μm in Example 1-1) and the maximum value that may be obtained from 2d×tan (arcsin(sin θl(k)/ns)) (that is, 105% of three times 81.5 μm: 256.7 μm in Example 1-3) when the thickness d of the substrate 100 is equal to or greater than 100 μm and equal to or less than 300 μm in Example 1-1, Example 1-2, and Example 1-3.

In Example 2-1, the distance 2d×tan(arcsin(sin θl(k)/ns)) is 6.1 μm. Therefore, when the width WR(1) of the overlapping region OR of the first light-emitting unit 152(1) (that is, the light-emitting unit 152 located closest to the first side S1 out of the plurality of light-emitting units 152 in the example shown in FIG. 1) is the above-mentioned distance, light can be prevented from leaking from the first light-emitting unit 152(1) toward the first location P1. Meanwhile, the width WR(1) of the overlapping region OR of the first light-emitting unit 152(1) need not strictly match the above-mentioned distance, and may be equal to or greater than 95% and equal to or less than 105% of 2d×tan(arcsin(sin θl(k)/ns)), that is, equal to or greater than 5.8 µm and equal to or less than 6.4 µm.

In Example 2-2, the distance 2d×tan(arcsin(sin θl(k)/ns)) is 8.5 µm. Therefore, when the width WR(1) of the overlapping region OR of the first light-emitting unit 152(1) (that is, the light-emitting unit 152 located closest to the first side S1 out of the plurality of light-emitting units 152 in the example shown in FIG. 1) is the above-mentioned distance, light can be prevented from leaking from the first light-emitting unit 152(1) toward the first location P1. Meanwhile, the width WR(1) of the overlapping region OR of the first light-emitting unit 152(1) need not strictly match the above-mentioned distance, and may be equal to or greater than 95% and equal to or less than 105% of 2d×tan(arcsin(sin θl(k)/ns)), that is, equal to or greater than 8.1 µm and equal to or less than 8.9 µm.

In Example 2-3, the distance 2d×tan(arcsin(sin θl(k)/ns)) is 15.1 µm. Therefore, when the width WR(1) of the overlapping region OR of the first light-emitting unit 152(1) (that is, the light-emitting unit 152 located closest to the first side S1 out of the plurality of light-emitting units 152 in the example shown in FIG. 1) is the above-mentioned distance, light can be prevented from leaking from the first light-emitting unit 152(1) toward the first location P1. Meanwhile, the width WR(1) of the overlapping region OR of the first light-emitting unit 152(1) need not strictly match the above-mentioned distance, and may be equal to or greater than 95% and equal to or less than 105% of 2d×tan(arcsin(sin θl(k)/ns)), that is, equal to or greater than 14.4 µm and equal to or less than 15.9 µm.

From Example 2-1, Example 2-2, and Example 2-3, in one example, it may be said the width WR(1) of the overlapping region OR of the first light-emitting unit 152(1) may be equal to or greater than 2.9 µm and equal to or less than 39.6 µm when the thickness d of the substrate 100 is equal to or greater than 10 µm and equal to or less than 50 µm and the refractive index ns of the substrate 100 is 1.6. This numerical value range is a range between the minimum value that may be obtained from 2d×tan(arcsin(sin θl(k)/ns)) (that is, 95% of half of 6.1 µm: 2.9 µm in Example 2-1) and the maximum value that may be obtained from 2d×tan(arcsin(sin θl(k)/ns)) (that is, 105% of two fifth of 15.1 µm: 39.6 µm in Example 2-3) when the thickness d of the substrate 100 is equal to or greater than 10 µm and equal to or less than 50 µm in Example 2-1, Example 2-2, and Example 2-3.

Figure 11:
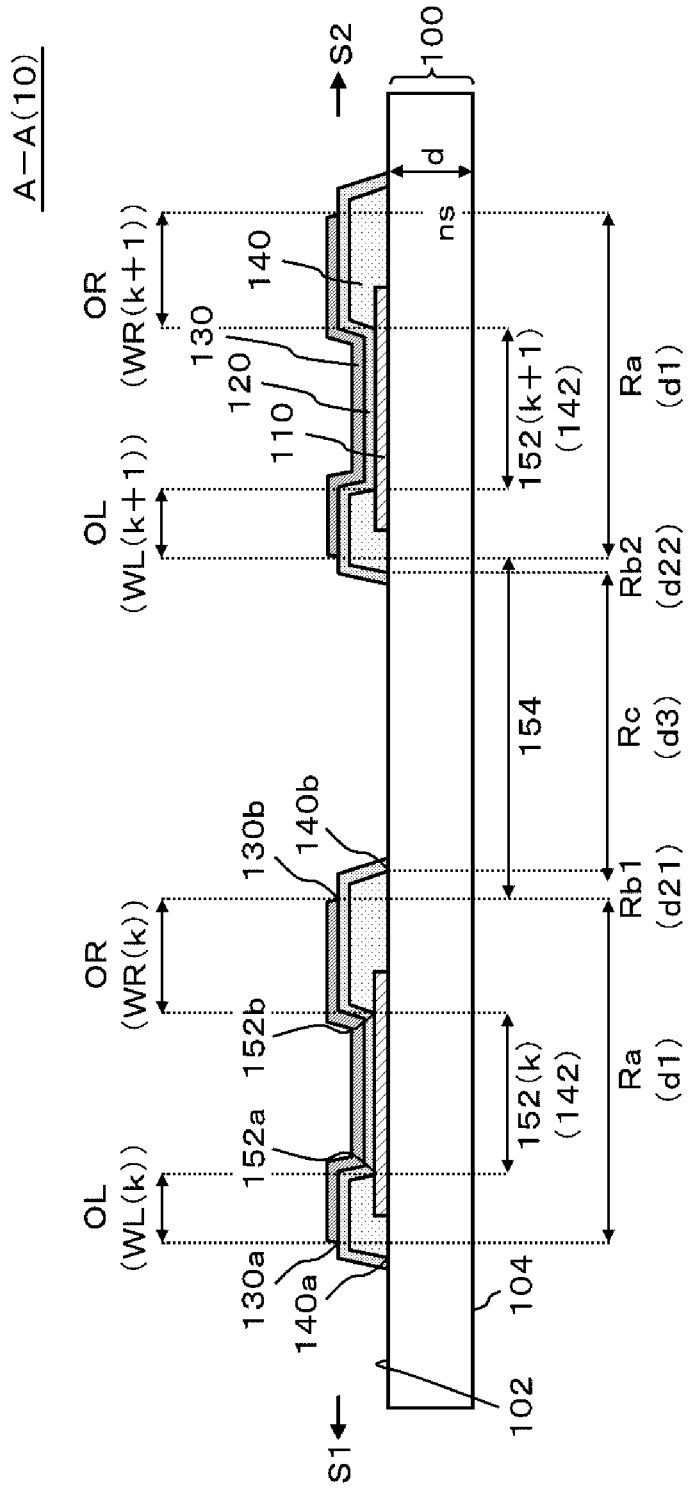
FIG. 11 is a diagram of a first modification example of FIG. 5.
Figure 12:
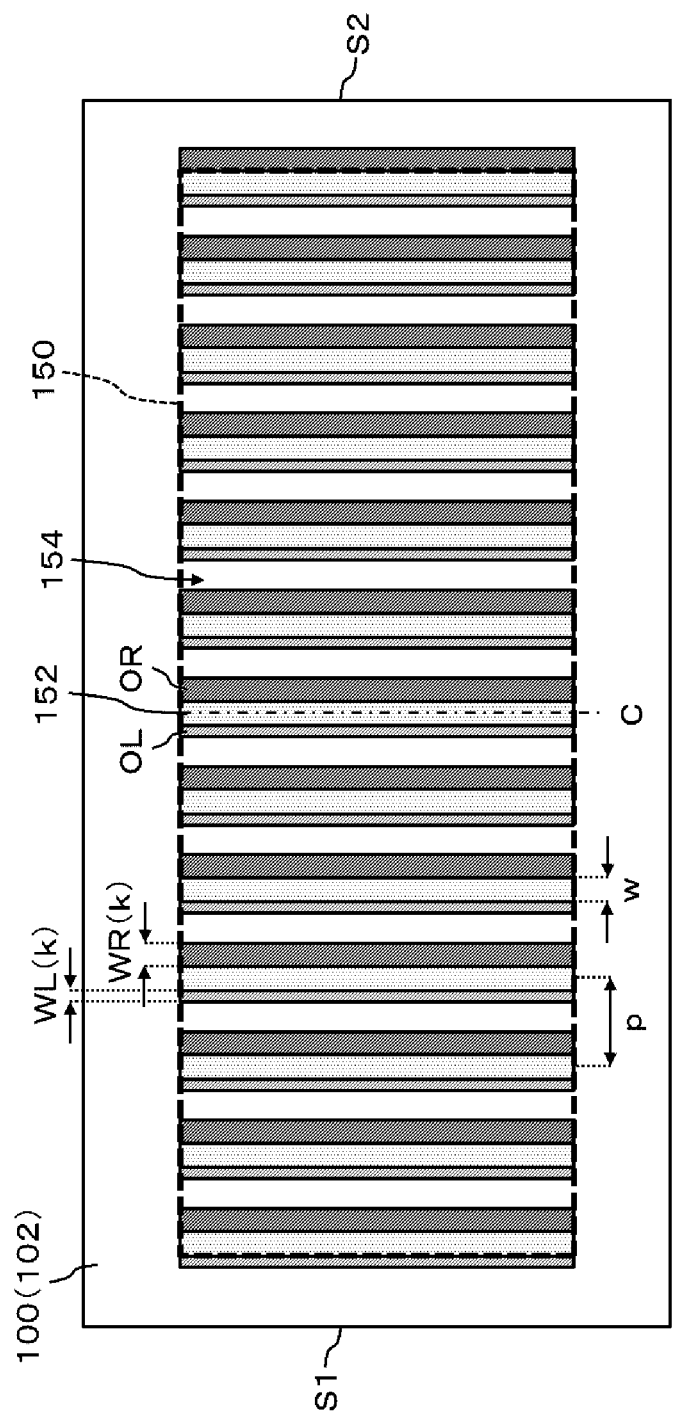
FIG. 12 is a diagram showing an example of the plan layout of the light-emitting unit and the overlapping region shown in FIG. 11.

FIG. 11 is a diagram of a first modification example of FIG. 5. FIG. 12 is a drawing showing an example of the plan layout of the light-emitting unit 152, the overlapping region OL, and the overlapping region OR shown in FIG. 11.

In the example shown in FIG. 11, the end (that is, the end 130a) of the second electrode 130 of the k-th light-emitting unit 152(k) on the first side S1 side exists on the outer side of the end 152a of the k-th light-emitting unit 152(k) by the width WL(k) of the overlapping region OL, and the end (that is, the end 130b) of the second electrode 130 of the k-th light-emitting unit 152(k) on the second side S2 exists on the outer side of the end 152b of the k-th light-emitting unit 152(k) by the width WR(k).

The width WL(k) and the width WR(k) are different from each other. Specifically, the width WR(k) is wider than the width WL(k). In other words, the width (that is, the width WR(k)) on a side closer to the second side S2 (in other words, a side closer to the first location P1 (FIG. 1)) is wider than the width (that is, the width WL(k)) on a side closer to the first side S1 (in other words, a side farther from the first location P1 (FIG. 1)).

In the example shown in the diagram, light can be prevented from leaking from the first light-emitting unit 152 toward the first location P1 (FIG. 1) while maintaining high light transmittance of the light-emitting device 10. Specifically, the overlapping region OL exists on the first side S1 side of the light-emitting unit 152, and therefore, the overlapping region OL does not contribute to preventing leakage of light from the light-emitting unit 152 toward the first location P1 (FIG. 1). Therefore, from the viewpoint of preventing light from the light-emitting unit 152 from leaking toward the first location P1 (FIG. 1), the width of the overlapping region OL need not be particularly wide, and may be narrow to a certain degree in order to achieve high light transmittance of the light-emitting device 10. In contrast, the width of the overlapping region OR is wide to a certain degree in order to prevent light from the light-emitting unit 152 from leaking toward the first location P1 (FIG. 1), and specifically, the width of the overlapping region OR is wider than the width of the overlapping region OL. In this manner, in the example shown in the diagram, light can be prevented from leaking from the first light-emitting unit 152 toward the first location P1 (FIG. 1) while maintaining high light transmittance of the light-emitting device 10.

In the example shown in FIG. 12, the widths of the plurality of overlapping regions OL are the same as each other (WL(1)=WL(2)= . . . WL(k)= . . . ). Similarly, the widths of the plurality of overlapping regions OR are the same as each other (WR(1)=WR(2)= . . . =WR(k)= . . . ).

A brightness distribution of the light-emitting region 150 is substantially constant from the first side S1 to the second side S2. Specifically, the widths w of the plurality of light-emitting units 152 are the same as each other. In addition, the pitch p of the plurality of light-emitting units 152 (the distance between centers of light-emitting units 152 adjacent to each other) is constant from the first side S1 to the second side S2. Thus, the brightness distribution of the light-emitting region 150 is substantially constant from the first side S1 to the second side S2.

In one example, the light-emitting device 10 shown in FIG. 11 and FIG. 12 may also be understood as follows. That is, the plurality of light-emitting units 152 include the light-emitting unit 152 below (the first light-emitting unit).

The end 130a of the second electrode 130 (light shielding layer) of the first light-emitting unit on the first side S1 exists away from the end 152a of the first light-emitting unit by a first distance, and the end 130b of the second electrode 130 (light shielding layer) of the first light-emitting unit on the second side S2 exists away from the end 152b of the first light-emitting unit by a second distance. The second distance is different from the first distance, and particularly in the examples shown in FIG. 11 and FIG. 12, the second distance is longer than the first distance.

Figure 13:
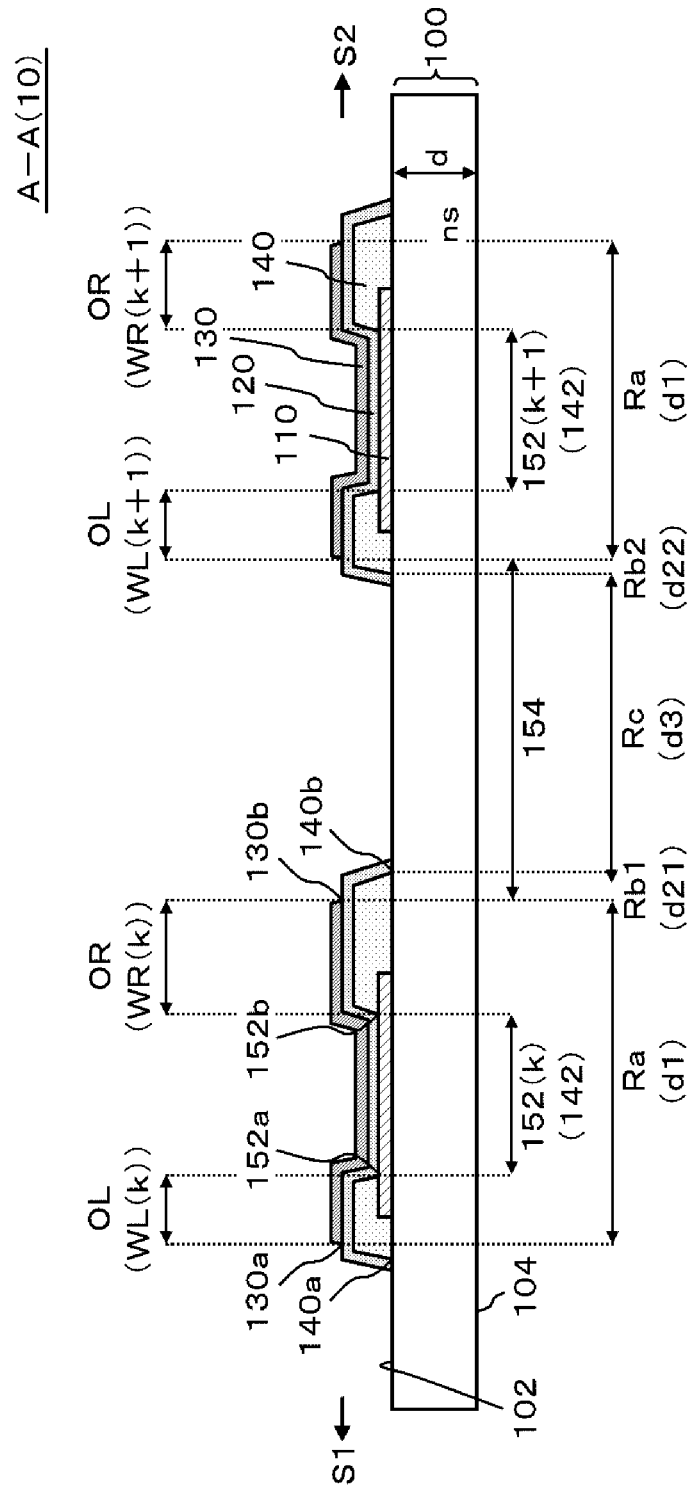
FIG. 13 is a diagram of a second modification example of FIG. 5.
Figure 14:
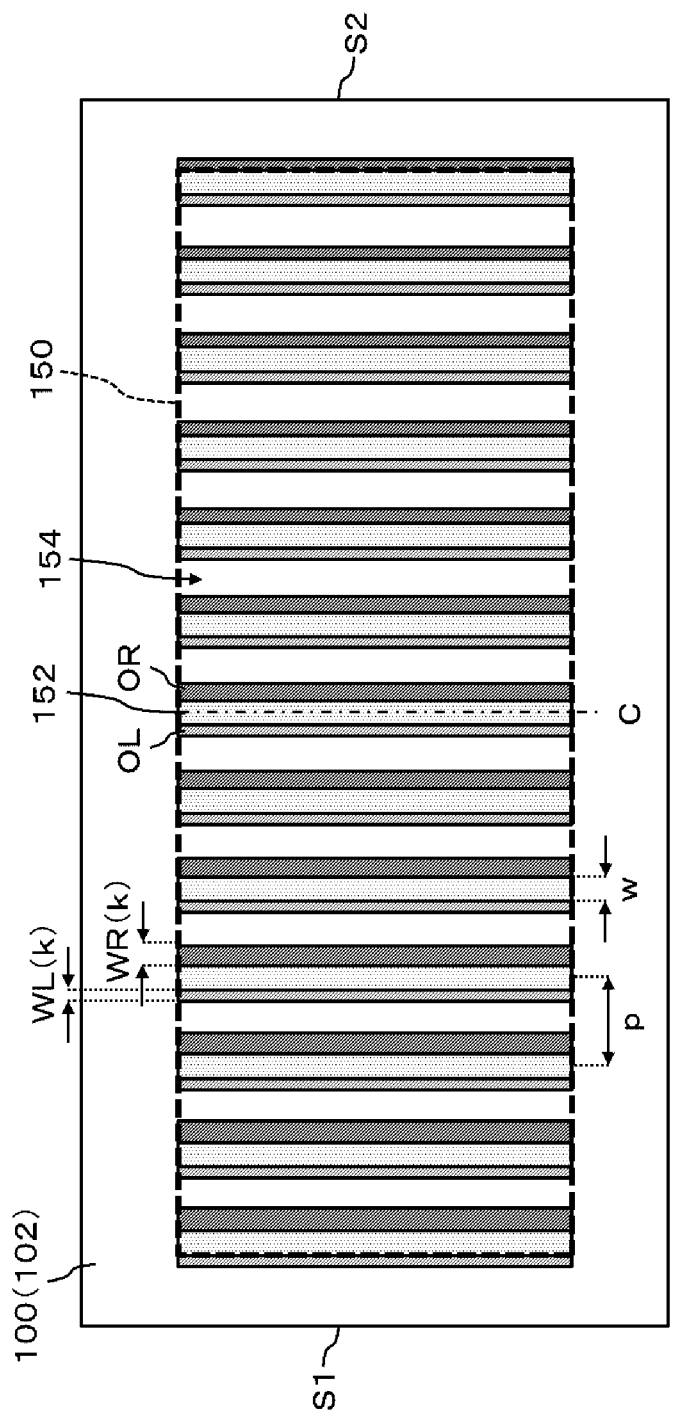
FIG. 14 is a diagram showing an example of the plan layout of the light-emitting unit and the overlapping region shown in FIG. 13.

FIG. 13 is a diagram of a second modification example of FIG. 5. FIG. 14 is a drawing showing an example of the plan layout of the light-emitting unit 152, the overlapping region OL, and the overlapping region OR shown in FIG. 13.

In the example shown in FIG. 13, the end (that is, the end 130b) of the second electrode 130 of the k-th light-emitting unit 152(k) on the second side S2 side exists on the outer side of the end 152b of the k-th light-emitting unit 152(k) by the width WR(k) of the overlapping region OR, and the end (that is, the end 130b) of the second electrode 130 of the k+1th light-emitting unit 152(k+1) on the second side S2 side exists on the outer side of the end 152b of the k+1th light-emitting unit 152(k+1) by the width WR(k+1) of the overlapping region OR.

The width WR(k) and the width WR(k+1) are different from each other, and specifically, the width WR(k+1) is narrower than the width WR(k). In other words, the width (that is, the width WR(k+1)) on the side closer to the second side S2 (in other words, a side closer to the first location P1 (FIG. 1)) is narrower than the width (that is, the width WR(k+1)) on the side closer to the first side S1 (in other words, the side farther from the first location P1 (FIG. 1)).

In the example shown in the diagram, light can be prevented from leaking from the first light-emitting unit 152 toward the first location P1 (FIG. 1) while maintaining high light transmittance of the light-emitting device 10. Specifically, as explained using FIG. 7, in a case where the width WR(k) of the overlapping region OR of the k-th light-emitting unit 152(k) is 2d×tan(arcsin(sin θl(k)/ns)), it is possible to shield most of the light leaked from the first surface 102 of the substrate 100 by the second electrode 130. In other words, the width WR(k) to shield most of the light leaked from the first surface 102 of the substrate 100 becomes smaller as the integer k becomes greater (that is, as the angle θ(k) becomes smaller). Therefore, from the viewpoint of preventing light from the light-emitting unit 152 from leaking toward the first location P1 (FIG. 1), the width WR(k+1) need not be the same as the width WR(k), and may be narrow to a certain degree in order to achieve high light transmittance of the light-emitting device 10. In contrast, the width WR(k) is wide to a certain degree in order to prevent light from the light-emitting unit 152 from leaking toward the first location P1 (FIG. 1), and specifically, the width WR(k) is wider than the width WL(k+1). Thus, in the example shown in the diagram, light can be prevented from leaking from the first light-emitting unit 152 toward the first location P1 (FIG. 1) while maintaining high light transmittance of the light-emitting device 10.

In the example shown in FIG. 14, the widths of the plurality of overlapping regions OL are the same as each other (WL(1)=WL(2)= . . . WL(k)= . . . ). In contrast, the widths of the plurality of overlapping regions OR become narrower from the first side S1 toward the second side S2 and more specifically, with respect to all integers k, WR(k)>WR(k+1) is established (WR(1)>WR(2)> . . . > WR(k)> . . . ).

Meanwhile, WR(k)>WR(k+1) need not be established with respect to all integers k. In one example, WR(k)=WR(k+1) may be established in some of the plurality of light-emitting units 152. As one example, there is a case where each of a plurality of WR(k) is the same as the other from an integer 1 to an integer a−1, and W(a) is smaller than W(a−1) with respect to an integer a, and each of the plurality of WR(k) is the same as the other with an integer of equal to or greater than the integer a (WR(1)=WR(2)= . . . = WR(a−1)>WR(a)=WR(a+1)= . . . ).

The brightness distribution of the light-emitting region 150 is substantially constant from the first side S1 to the second side S2. Specifically, the widths w of the plurality of light-emitting units 152 are the same as each other. In addition, the pitch p of the plurality of light-emitting units 152 (the distance between centers of light-emitting units 152 adjacent to each other) is constant from the first side S1 to the second side S2. Thus, the brightness distribution of the light-emitting region 150 is substantially constant from the first side S1 to the second side S2.

In one example, the light-emitting device 10 shown in FIG. 13 and FIG. 14 may also be understood as follows. That is, the plurality of light-emitting units 152 include two light-emitting units 152 below (first and second light-emitting units).

The end 130b of the second electrode 130 (light shielding layer) of the first light-emitting unit on the second side S2 exists away from the end 152b of the first light-emitting unit by the first distance, and the end 130b of the second electrode 130 (light shielding layer) of the second light-emitting unit on the second side S2 exists away from the end 152b by the second distance. The second distance is different from the first distance, and particularly in the example shown in FIG. 14, the second distance is shorter than the first distance when the first light-emitting unit is closer to the first side S1 than the second light-emitting unit.

In another example, the light-emitting device 10 shown in FIG. 13 and FIG. 14 may also be understood as follows. That is, the plurality of light-emitting units 152 includes the two light-emitting units 152 below (the first light-emitting unit and the second light-emitting unit).

The end 130a of the second electrode 130 (light shielding layer) of the first light-emitting unit on the first side S1 exists away from the end 152a of the first light-emitting unit by the first distance, and the end 130b of the second electrode 130 (light shielding layer) of the first light-emitting unit on the second side S2 exists away from the end 152b of the first light-emitting unit by the second distance. The second distance is different from the first distance, and particularly in the examples shown in FIG. 13 and FIG. 14, the second distance is longer than the first distance.

In addition, the end 130b of the second electrode 130 (light shielding layer) of the second light-emitting unit on the second side S2 exists away from the end 152b of the second light-emitting unit by a third distance. The third distance is different from the second distance, and particularly in the examples shown in FIG. 13 and FIG. 14, the third distance is shorter than the second distance when the first light-emitting unit is closer to the first side S1 than the second light-emitting unit.

In addition, the end 130a of the second electrode 130 (light shielding layer) of the second light-emitting unit on the first side S1 exists away from the end 152a of the second light-emitting unit by a fourth distance. The fourth distance is different from the third distance, and particularly in the examples shown in FIG. 13 and FIG. 14, the fourth distance is shorter than the third distance.

Figure 15:
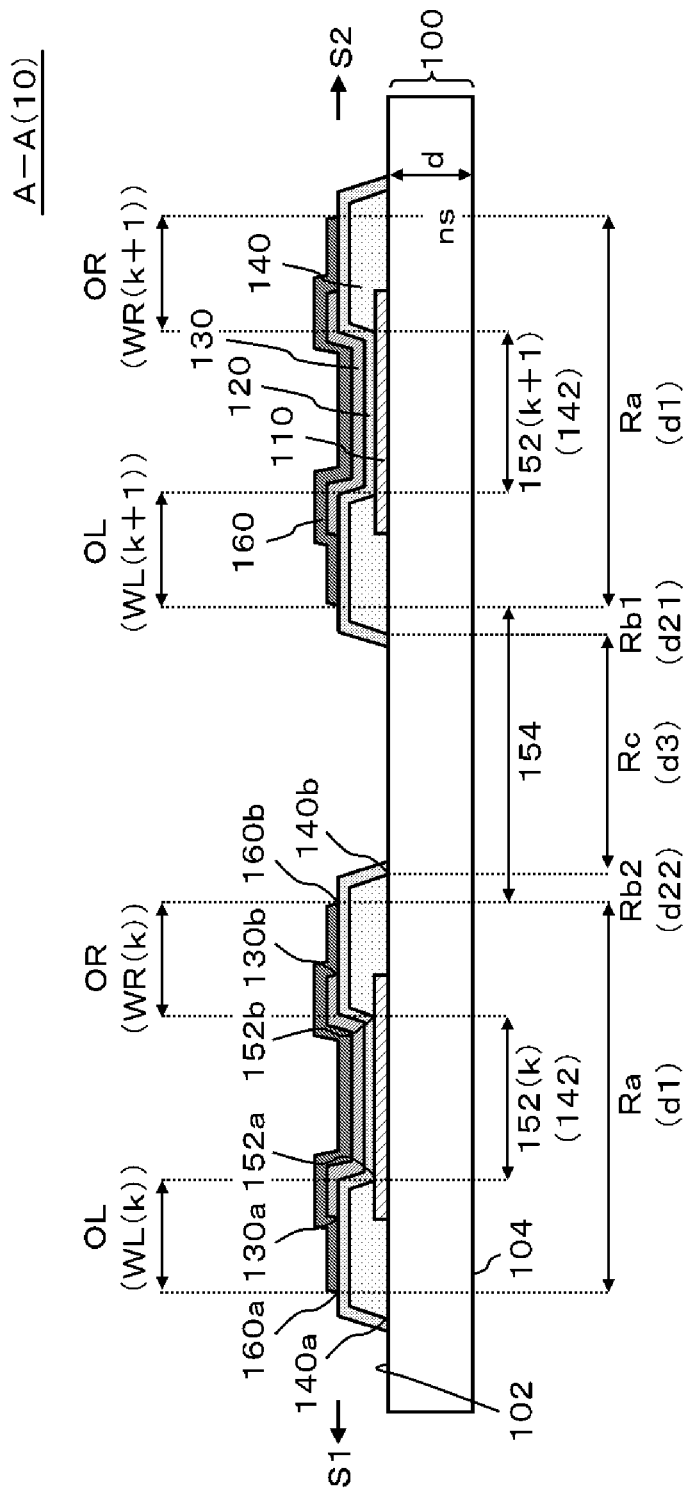
FIG. 15 is a diagram of a third modification example of FIG. 5.

FIG. 15 is a diagram of a third modification example of FIG. 5. In the example shown in the diagram, the light-emitting device 10 includes a light shielding layer 160. The light shielding layer 160 covers the second electrode 130. Particularly in the example shown in the diagram, the width of the light shielding layer 160 is wider than the width of the second electrode 130. Thus, the light-emitting unit 152 includes a laminating structure of the first electrode 110, the organic layer 120, the second electrode 130, and the light shielding layer 160 laminated in this order. The light shielding layer 160 includes an end 160a and an end 160b. The end 160a faces the first side S1. The end 160b faces the second side S2 and is on the opposite side of the first side S1.

In the k-th light-emitting unit 152(k), the end 160a of the light shielding layer 160 exists on the outer side of the end 130a of the second electrode 130, and specifically, the end 160a of the light shielding layer 160 exists on the outer side of the end 152a of the k-th light-emitting unit 152(k) by the width WL(k) of the overlapping region OL. In other words, in the example shown in the diagram, a region overlapped with the light shielding layer 160 functions as the overlapping region OL. Similarly, in the k-th light-emitting unit 152(k), the end 160b of the light shielding layer 160 exists on the outer side of the end 130b of the second electrode 130, and specifically, the end 160b of the light shielding layer 160 exists on the outer side of the end 152b of the k-th light-emitting unit 152(k) by the width WR(k) of the overlapping region OR. In other words, in the example shown in the diagram, the region overlapped with the light shielding layer 160 functions as the overlapping region OR.

In one example, the light shielding layer 160 is a black matrix layer. In this example, the light shielding layer 160 includes, for example, a chromium oxide or a manganese oxide.

Figure 16:
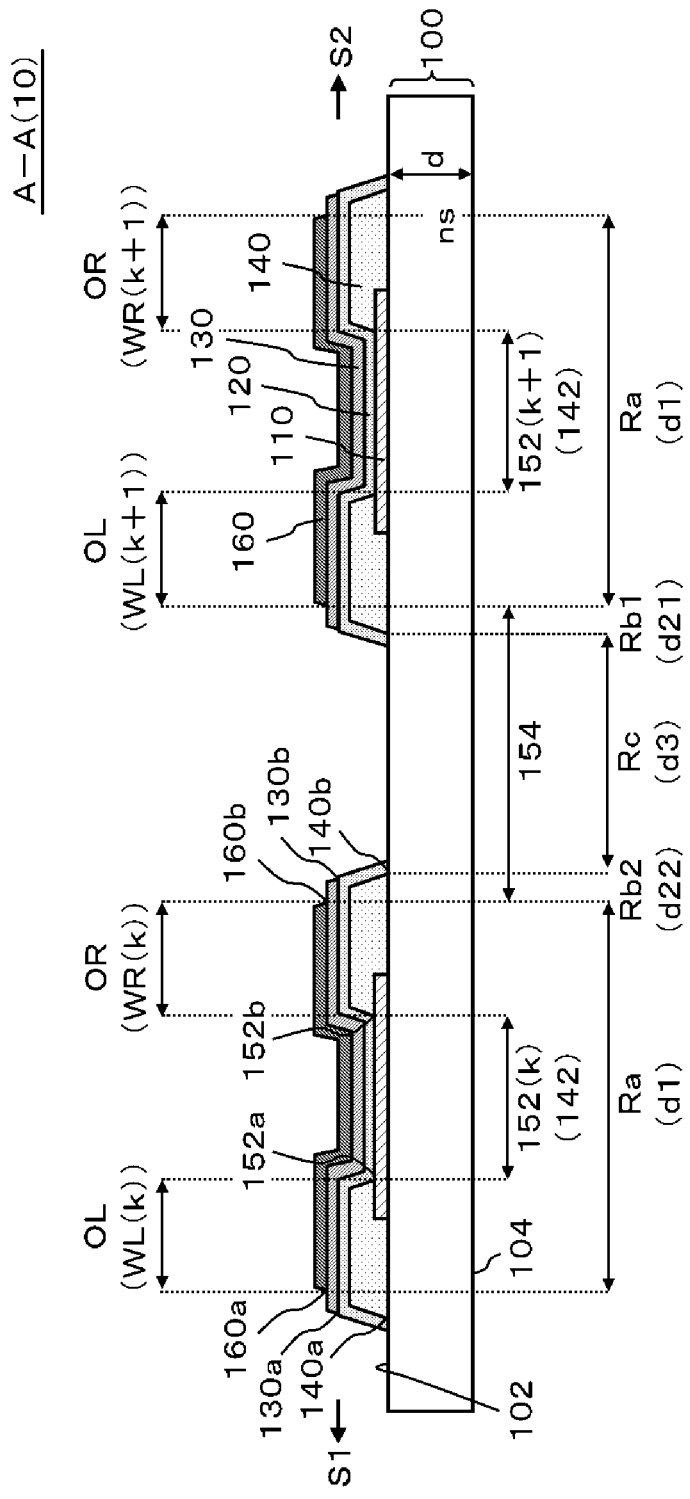
FIG. 16 is a diagram of a fourth modification example of FIG. 5.

FIG. 16 is a diagram of a fourth modification example of FIG. 5. In the example shown in the diagram, the light-emitting device 10 includes the light shielding layer 160. The light shielding layer 160 covers the second electrode 130. Particularly in the example shown in the diagram, the width of the light shielding layer 160 is narrower than the width of the second electrode 130. More specifically, the end 160a of the light shielding layer 160 exists on the inner side of the end 130a of the second electrode 130, and the end 160b of the light shielding layer 160 exists on the inner side of the end 130b of the second electrode 130.

The second electrode 130 may or may not have light shielding properties. Particularly in the example shown in the diagram, the second electrode 130 does not have light shielding properties, but has optical transparency. Therefore, the second electrode 130 does not function as a light shielding layer. Therefore, an end on the first side S1 of the overlapping region OL is determined not by the end 130a of the second electrode 130 but by the end 160a of the light shielding layer 160, and an end on the second side S2 of the overlapping region OR is determined not by the end 130b of the second electrode 130 but by the end 160b of the light shielding layer 160.

Meanwhile, the width of the light shielding layer 160 may be the same as the width of the second electrode 130. Further in this case, the end 160a and the end 160b of the light shielding layer 160 may be aligned with the end 130a and the end 130b of the second electrode 130.

As described above, according to the present embodiment, an end (that is, the end 130b) of the second electrode 130 of the k-th light-emitting unit 152(k) on the first location P1 side (that is, the second side S2) exists on the outer side of the end 152b of the k-th light-emitting unit 152(k) by equal to or greater than $d \times \tan(\arcsin(\sin \theta l(k)/ns))$. Therefore, light can be prevented from leaking from the k-th first light-emitting unit 152(k) toward the first location P1.

In addition, according to the present embodiment, in one light-emitting unit 152, the width WL of the overlapping region OL and the width WR of the overlapping region OR may be different from each other. In this case, light can be prevented from leaking from the first light-emitting unit 152 toward the first location P1 while maintaining high light transmittance of the light-emitting device 10.

In addition, according to the present embodiment, the width of the overlapping region OR of one light-emitting unit 152 and the width of the overlapping region OR of another light-emitting unit 152 may be different from each other. In this case, light can be prevented from leaking from the first light-emitting unit 152 toward the first location P1 while maintaining high light transmittance of the light-emitting device 10.

Second Embodiment

Figure 17:
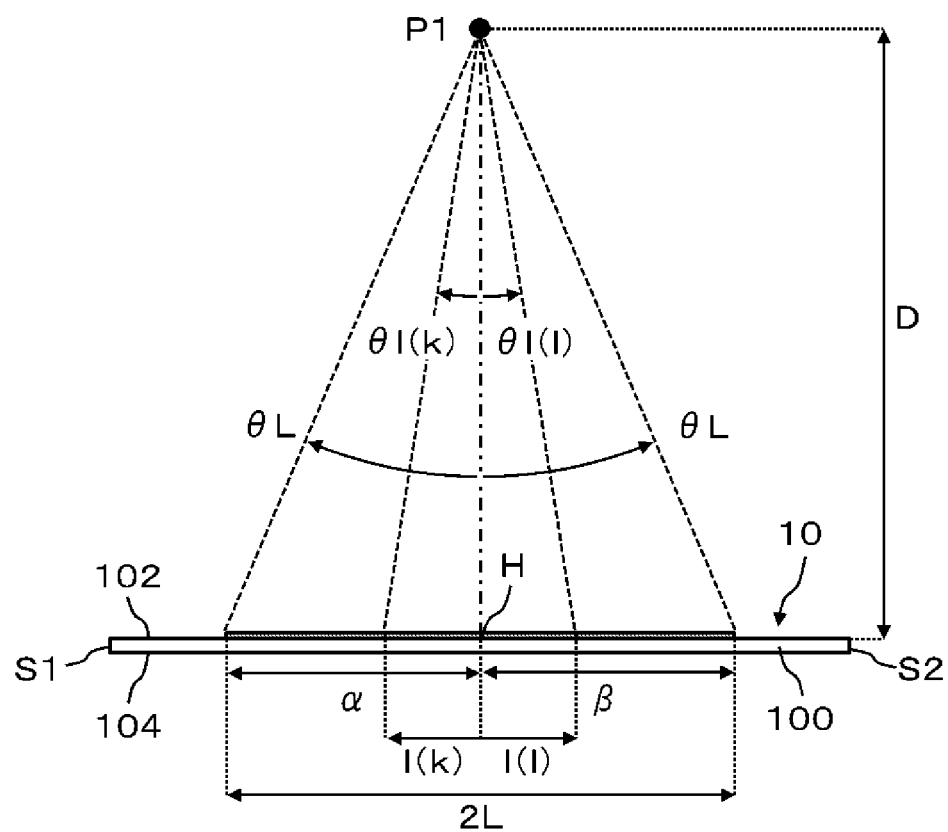
FIG. 17 is a diagram of a light-emitting system according to the second embodiment.
Figure 18:
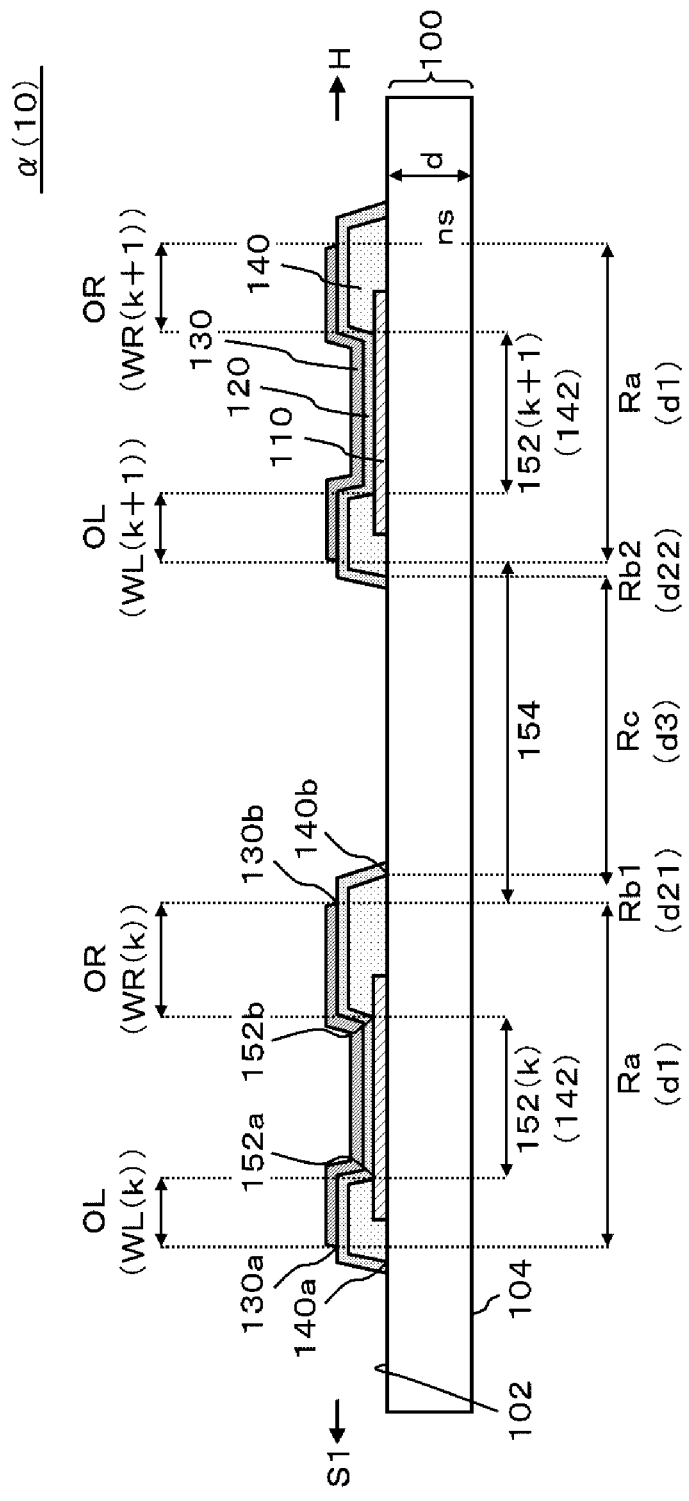
FIG. 18 is a cross-sectional view of the region α of the light-emitting device shown in FIG. 17.
Figure 19:
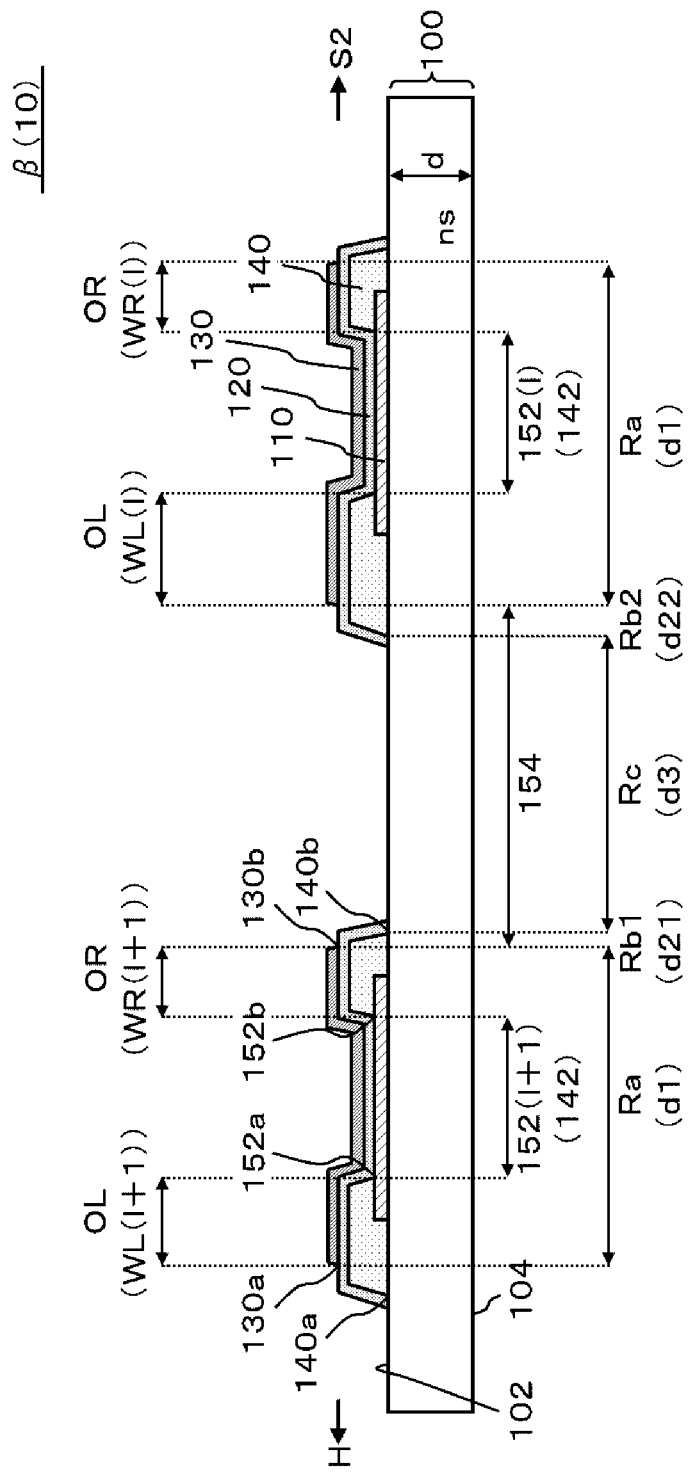
FIG. 19 is a cross-sectional view of the region β of the light-emitting device shown in FIG. 17.

FIG. 17 is diagram of a light-emitting system 20 according to the second embodiment and corresponds to FIG. 1 of the first embodiment. FIG. 18 is a cross-sectional view of a region α of the light-emitting device 10 shown in FIG. 17. FIG. 19 is a cross-sectional view of a region β of the light-emitting device 10 shown in FIG. 17. The light-emitting system 20 according to the present embodiment is the same as the light-emitting system 20 according to the first embodiment except the following points.

In the example shown in FIG. 17, the perpendicular line from the first location P1 to the first surface 102 of the substrate 100 intersects at the location H of the first surface 102 of the substrate 100, and the light-emitting region 150 spreads from the location H toward both of the first side S1 and the second side S2. More specifically, in the example shown in the diagram, the location H is on the center of the light-emitting region 150.

The plurality of light-emitting units 152 include the k-th light-emitting unit 152(k) at the k-th unit from the first side S1 of the substrate 100. The k-th light-emitting unit 152(k) exists in a direction of the angle θl(k) when viewed from the first location P1. In other words, the k-th light-emitting unit 152(k) exists at a location apart from the location H by the distance l(k), thus $\theta l(k) = \arctan(l(k)/D)$.

The plurality of light-emitting units 152 include a l-th light-emitting unit 152(l) at the l-th unit from the second side S2 of the substrate 100. The l-th light-emitting unit 152(l) exists in a direction of an angle θl(l) when viewed from the first location P1. In other words, the l-th light-emitting unit 152(l) exists at a location apart from the location H by a distance L(l), thus $\theta l(l) = \arctan(l(l)/D)$.

As shown in FIG. 18, an end (that is, the end 130b) of the second electrode 130 of the k-th light-emitting unit 152(k) on the first location P1 side (that is, the location H side) exists on the outer side of the end 152b of the k-th light-emitting unit 152(k) by the width WR(k) of the overlapping region OR. In one example, the width WR(k) is equal to or greater than $d \times \tan(\arcsin(\sin \theta l(k)/ns))$ and equal to or less than $3d \times \tan(\arcsin(\sin \theta l(k)/ns))$ ($d \times \tan(\arcsin(\sin \theta l(k)/ns)) \le WR(k) \le 3d \times \tan(\arcsin(\sin \theta l(k)/ns))$). Thus, as is the case with the first embodiment, light can be prevented from leaking from the k-th light-emitting unit 152(k) toward the first location P1 and it is possible to maintain high light transmittance of the light-emitting device 10.

The end (that is, the end 130a) of the second electrode 130 of the k-th light-emitting unit 152(k) on the first side S1 side exists on the outer side of the end 152a of the k-th light-emitting unit 152(k) by the width WL(k) of the overlapping region OL, and an end (that is, the end 130b) of the second electrode 130 of the k-th light-emitting unit 152(k) on the location H side exists on the outer side of the end 152b of the k-th light-emitting unit 152(k) by the width WR(k) of the overlapping region OR.

The width WL(k) and the width WR(k) are different from each other, and specifically, the width WR(k) is wider than the width WL(k). Thus, as is the case with the example explained using FIG. 11, light can be prevented from leaking from the light-emitting unit 152 toward the first location P1 (FIG. 17) while maintaining high light transmittance of the light-emitting device 10.

In addition, the end (that is, the end 130b) of the second electrode 130 of the k-th light-emitting unit 152(k) on the location H side exists on the outer side of the end 152b of the k-th light-emitting unit 152(k) by the width WR(k) of the overlapping region OR, and an end (that is, the end 130b) of the second electrode 130 of the k+1-th light-emitting unit 152(k+1) on the location H side exists on the outer side of the end 152b of the k+1-th light-emitting unit 152(k+1) by the width WR(k+1) of the overlapping region OR.

The width WR(k) and the width WR(k+1) are different from each other, and specifically, the width WR(k+1) is narrower than the width WR(k). Thus, as is the case with the example explained using FIG. 13, light can be prevented from leaking from the light-emitting unit 152 toward the first location P1 (FIG. 17) while maintaining high light transmittance of the light-emitting device 10.

As shown in FIG. 19, an end (that is, the end 130a) of the second electrode 130 of the l-th light-emitting unit 152(l) on the first location P1 side (that is, the location H side) exists on the outer side of the end 152a of the l-th light-emitting unit 152(l) by the width WL(l) of the overlapping region OL. In one example, the width WL(l) is equal to or greater than d×tan(arcsin(sin θl(l)/ns)) and equal to or less than 3d×tan(arcsin(sin θl(l)/ns)) (d×tan(arcsin(sin θl(l)/ns))≤WL(l)≤3d×tan(arcsin(sin θl(l)/ns))). Thus, as is the case with the first embodiment, light can be prevented from leaking from the k-th light-emitting unit 152(k) toward the first location P1 and it is possible to maintain high light transmittance of the light-emitting device 10.

The end (that is, the end 130b) of the second electrode 130 of the l-th light-emitting unit 152(l) on the second side S2 side exists on the outer side of the end 152b of the l-th light-emitting unit 152(l) by the width WR(l) of the overlapping region OR, and the end (that is, the end 130a) of the second electrode 130 of the l-th light-emitting unit 152(l) on the location H side exists on the outer side of the end 152b of the l-th light-emitting unit 152(l) by the width WL(l) of the overlapping region OL.

The width WL(l) and the width WR(l) are different from each other, and specifically, the width WL(l) is wider than the width WR(l). Thus, as is the case with the example explained using FIG. 11, light can be prevented from leaking from the light-emitting unit 152 toward the first location P1 (FIG. 17) while maintaining high light transmittance of the light-emitting device 10.

In addition, the end (that is, the end 130a) of the second electrode 130 of the l-th light-emitting unit 152(l) on the location H side exists on the outer side of the end 152a of the l-th light-emitting unit 152(l) by the width WL(l) of the overlapping region OL, and an end (that is, the end 130a) of the second electrode 130 of a l+1-th light-emitting unit 152(l+1) on the location H side exists on the outer side of the end 152a of the l+1-th light-emitting unit 152(l+1) by the width WL(l+1) of the overlapping region OL.

The width WL(l) and the width WR(l+1) are different from each other, and specifically, the width WL(l+1) is narrower than the width WL(l). Thus, as is the case with the example explained using FIG. 13, light can be prevented from leaking from the light-emitting unit 152 toward the first location P1 (FIG. 17) while maintaining high light transmittance of the light-emitting device 10.

Figure 20:
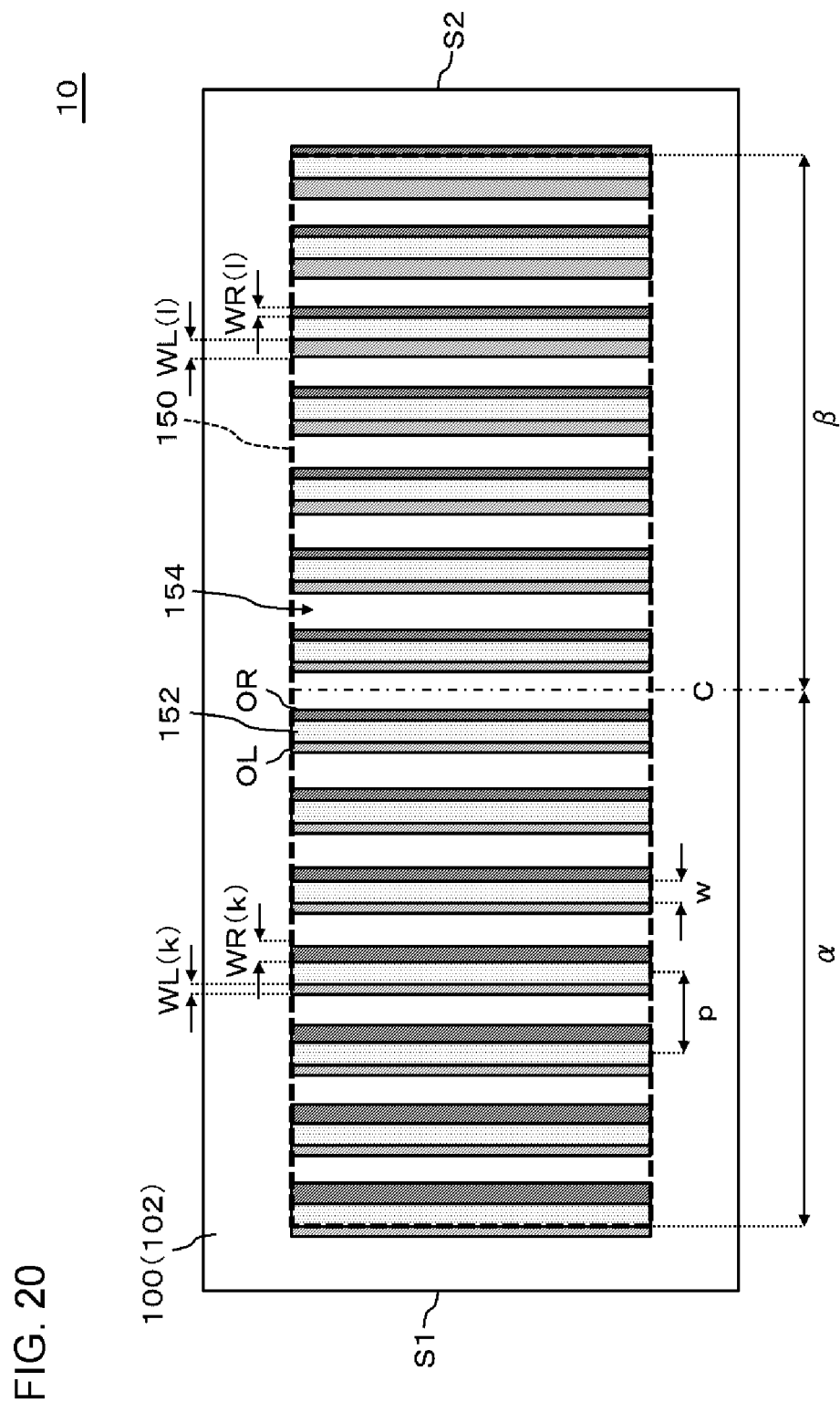
FIG. 20 is a diagram showing a first example of the plan layout of the light-emitting unit and the overlapping region shown in FIG. 18 and FIG. 19.

FIG. 20 is a drawing showing a first example of the plan layout of the light-emitting unit 152, the overlapping region OL, and the overlapping region OR shown in FIG. 18 and FIG. 19. In the example shown in the diagram, the region α and the region β are located on the opposite side of each other with the center C of the light-emitting region 150 therebetween.

In the region α, the widths of the plurality of overlapping regions OL are the same as each other (WL(1)=WL(2)= . . . WL(k)= . . . ). In contrast, in the region α, the widths of the plurality of overlapping regions OR become narrower from the first side S1 toward the second side S2, and more specifically, with respect to all integers k, WR(k)>WR(k+1) is established (WR(1)>WR(2)> . . . >WR(k)> . . . ). Meanwhile, as is the case with the example explained using FIG. 14, WR(k)>WR(k+1) need not be established with respect to all integers k.

In the region β, the widths of the plurality of overlapping regions OR are the same as each other (WR(1)=WR(2)= . . . WR(l)= . . . ). In contrast, in the region β, the widths of the plurality of overlapping regions OL become narrower from the second side S2 toward the first side S1, and more specifically, with respect to all integers l, WL(l)>WL(l+1) is established (WL(1)>WL(2)> . . . >WL(l)> . . . ). Meanwhile, as is the case with the example explained using FIG. 14, WR(l)>WR(l+1) need not be established with respect to all integers l.

In addition, each width of the plurality of overlapping regions OR in the region α, and each width of the plurality of overlapping regions OL in the region β become narrower from the first side S1 toward the center C, and become wider from the center C toward the second side S2. Particularly in the present drawing, each of the width WR(1) to the width WR(K) of K overlapping regions OR in the region α and each of the width WL(1) to the width WL(L) of L overlapping regions OL in the region β satisfy WR(1)>WR(2)> . . . >WR(K)=WL(L)< . . . <WL(2)<WL(1). Thus, the overlapping region OR in the region α includes the overlapping region OR having the width WR(k1) and the overlapping region OR having the width WR(k2) which is narrower than the width WR(k1) (k2>k1). In addition, the plurality of overlapping region OL in the region β includes the overlapping region OL having the width WL(l1) which is wider than the width WR(k2).

The brightness distribution of the light-emitting region 150 is substantially constant from the first side S1 to the second side S2. Specifically, the widths w of the plurality of light-emitting units 152 are the same as each other. In addition, the pitch p of the plurality of light-emitting units 152 (the distance between centers of light-emitting units 152 adjacent to each other) is constant from the first side S1 to the second side S2. Thus, the brightness distribution of the light-emitting region 150 is substantially constant from the first side S1 to the second side S2.

In the example shown in the diagram, light can be prevented from leaking from the light-emitting unit 152 toward the first location P1 (FIG. 17) while maintaining high light transmittance at the center C and the surroundings thereof in the light-emitting region 150. Specifically, in the example shown in the diagram, the area occupied by the light-transmitting unit 154 becomes larger toward the center of the light-emitting region 150. Therefore, it is possible to achieve high light transmittance at the center C and the surroundings thereof in the light-emitting region 150. On the other hand, near the first side S1, light from the light-emitting unit 152 is prevented from leaking toward the first location P1 (FIG. 17) by the overlapping region OR. Near the second side S2, light from the light-emitting unit 152 is prevented from leaking toward the first location P1 (FIG. 17) by the overlapping region OL.

In one example, the light-emitting device 10 shown in FIG. 20 may also be understood as follows. That is, the plurality of light-emitting units 152 include three light-emitting units 152 below (the first light-emitting unit, the second light-emitting unit, and the third light-emitting unit).

The end 130b of the second electrode 130 (light shielding layer) of the first light-emitting unit on the second side S2 exists away from the end 152b of the first light-emitting unit by the first distance, the end 130b of the second electrode 130 (light shielding layer) of the second right-emitting unit on the second side S2 exists away from the end 152b of the second light-emitting unit by the second distance, and the end 130a of the second electrode 130 (light shielding layer) of the third light-emitting unit on the first side S1 exists away from the end 152a of the third light-emitting unit by the third distance. The second distance is different from the first distance, and particularly in the example shown in FIG. 20, the second distance is shorter than the first distance when the first light-emitting unit and the second light-emitting unit are located on the first side S1 of the center C of the light-emitting region 150 and the first light-emitting unit is closer to the first side S1 than the second light-emitting unit. In this case, the third distance is longer than the second distance when the third light-emitting unit is located on the second side S2 of the center C of the light-emitting region 150 and is more apart from the center C of the light-emitting region 150 than the second light-emitting unit.

In another example, the light-emitting device 10 shown in FIG. 20 may also be understood as follows. That is, the plurality of light-emitting units 152 include three light-emitting units 152 (the first light-emitting unit, the second light-emitting unit, and the third light-emitting unit) below.

The end 130a of the second electrode 130 (light shielding layer) of the first light-emitting unit on the first side S1 exists away from the end 152a of the first light-emitting unit by the first distance, and the end 130b of the second electrode 130 (light shielding layer) of the first light-emitting unit on the second side S2 exists away from the end 152b of the first light-emitting unit by the second distance. The second distance is different from the first distance, and particularly in the examples shown in FIG. 20, the second distance is longer than the first distance when the first light-emitting unit is located on the first side S1 of the center C of the light-emitting region 150 and is shorter than the first distance when the first light-emitting unit is located on the second side S2 of the center C of the light-emitting region 150.

Further, the end 130b of the second electrode 130 (light shielding layer) of the second light-emitting unit on the second side S2 exists away from the end 152b of the second light-emitting unit by the third distance. The third distance is different from the second distance, and particularly in the example shown in FIG. 20, the third distance is shorter than the second distance when the first light-emitting unit and the second light-emitting unit are located on the first side S1 of the center C of the light-emitting region 150 and the first light-emitting unit is closer to the first side S1 than the second light-emitting unit.

In addition, the end 130a of the second electrode 130 (light shielding layer) of the second light-emitting unit on the first side S1 exists away from the end 152a of the second light-emitting unit by the fourth distance. The fourth distance is different from the third distance, and particularly in the example shown in FIG. 20, the fourth distance is shorter than the third distance when the second light-emitting unit is located on the first side S1 of the center C of the light-emitting region 150 and the fourth distance is longer than the third distance when the second light-emitting unit is located on the second side S2 of the center C of the light-emitting region 150.

Further, the end 130a of the second electrode 130 (light shielding layer) of the third light-emitting unit on the first side S1 exists away from the end 152a of the third light-emitting unit by a fifth distance. The third light-emitting unit is closer to the second side S2 than the first light-emitting unit and the second light-emitting unit. The fifth distance is different from the third distance, and particularly in the example shown in FIG. 20, the fifth distance is longer than the third distance when the second light-emitting unit is located on the first side S1 of the center C of a light-emitting region, the third light-emitting unit is located on the second side S2 of the center C of the light-emitting region, and the third light-emitting unit is more apart from the center C of a light-emitting region than the second light-emitting unit.

In addition, the end 130b of the second electrode 130 (light shielding layer) of the third light-emitting unit on the second side S2 exists away from the end 152b of the third light-emitting unit by a sixth distance. The sixth distance is different from the fifth distance.

Figure 21:
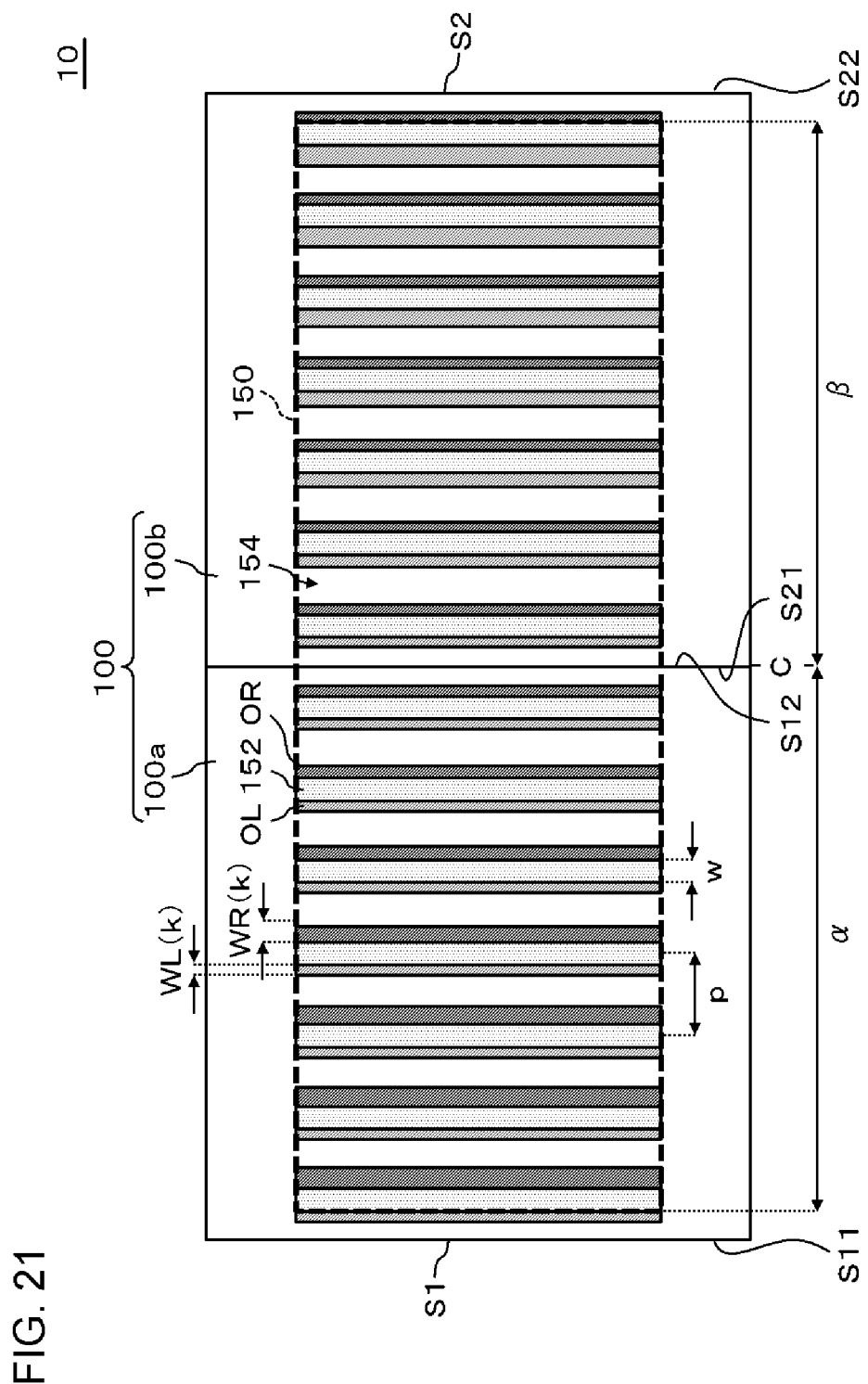
FIG. 21 is a diagram showing a second example of the plan layout of the light-emitting unit and the overlapping region shown in FIG. 18 and FIG. 19.

FIG. 21 is a drawing showing a second example of the plan layout of the light-emitting unit 152, the overlapping region OL, and the overlapping region OR shown in FIG. 18 and FIG. 19. This second example is the same as the first example described using FIG. 20 except the following points.

The substrate 100 includes a first substrate 100a and a second substrate 100b. The first substrate 100a includes a side S11 and a side S12, the side S11 functioning as the first side S1. The side S12 is on the opposite side of the side S11. The second substrate 100b includes a side S21 and a side S22. The side S21 functions as the second side S2. The side S22 is on the opposite side of the side S21. The first substrate 100a and the second substrate 100b are aligned so that the side S12 of the first substrate 100a and the side S22 of the second substrate 100b face each other. In one example, the side S12 of the first substrate 100a and the side S22 of the second substrate 100b may be joined to each other.

In the example shown in the diagram, the plan layout shown in FIG. 20 is implemented using the first substrate 100a and the second substrate 100b. Specifically, the plurality of light-emitting units 152 in the region α are located within the first substrate 100a. In contrast, the plurality of light-emitting units 152 in the region β are located within the second substrate 100b. In a case where the side S12 of the first substrate 100a and the side S22 of the second substrate 100b face each other, the light-emitting region 150 which is the same as the light-emitting region 150 shown in FIG. 20 is formed over the first side S1 and the second side S2.

In the example shown in the diagram also, as is the case with the example shown in FIG. 20, light can be prevented from leaking from the light-emitting unit 152 toward the first location P1 (FIG. 17) while maintaining high light transmittance at the center C of the light-emitting region 150 and the surroundings thereof.

As described above, according to the present embodiment, as is the case with the first embodiment, light can be prevented from leaking from the k-th light-emitting unit 152(k) toward the first location P1, and light can be prevented from leaking from the l-th light-emitting unit 152(l) toward the first location P1.

In addition, according to the present embodiment, the area occupied by the light-transmitting unit 154 may become larger toward the center of the light-emitting region 150.

Thus, it is possible to achieve high light transmittance at the center C in the light-emitting region 150 and the surroundings thereof.

As described above, although the embodiments and examples of the present invention have been set forth with reference to the accompanying drawings, they are merely illustrative of the present invention, and various configurations other than those stated above can be adopted.

This application claims priority from Japanese Patent Application No. 2016-245789, filed Dec. 19, 2016, the disclosure of which is incorporated by reference in its entirety.

The invention claimed is:

1. A light-emitting device comprising:
a plurality of light-emitting units located on a first surface side of a substrate having a thickness d and a refractive index ns, the first surface side extending from a first side to a second side, each light-emitting unit having a light shielding layer; and
a plurality of light-transmitting unit located between the plurality of light-emitting units,
wherein each of the plurality of light-emitting units comprises a laminating structure of a first electrode, an organic layer, and the light shielding layer laminated in this order,
wherein the plurality of light-emitting units comprises:
a first light-emitting unit located the farthest from the first side than any of the other of the plurality of light-emitting units, and
a second light-emitting unit located closer to the first side than the first light-emitting unit,
wherein the light shielding layer of the first light-emitting unit extends from a first end to a second end, the first end located outside a third end of the laminating structure of the first light-emitting unit on the first side, the second end located outside a fourth end of the laminating structure of the first light-emitting unit on the second side,
wherein the light shielding layer of the first light-emitting unit comprises:
a first width extending from the third end of the laminating structure of the first light-emitting unit to the the first end of the light shielding layer of the first light-emitting unit, and
a second width extending from the fourth end of the laminating structure of the first light-emitting unit to the second end of the light shielding layer of the first light-emitting unit,
wherein the light shielding layer of the second light-emitting unit extends from a fifth end to a sixth end, the fifth end located outside a seventh end of the laminating structure of the second light-emitting unit on the first side, the sixth end located outside an eighth end of the laminating structure of the second light-emitting unit on the second side,
wherein the light shielding layer of the second light-emitting unit comprises a third width extending from the seventh end of the laminating structure of the second light-emitting unit to the fifth end of the light shielding layer of the second light-emitting unit,
wherein the plurality of light transmitting units comprises:
a first light transmitting unit that extends from the first end of the light shielding layer of the first light-emitting unit to the sixth end of the light shielding layer of the second light-emitting unit, and
a second light transmitting unit that extends from the fifth end of the light shielding layer of the second light-emitting unit,
wherein the first width is different than the second width, and
wherein the third width is shorter than the first width.

2. The light-emitting device according to claim 1, wherein an end of the light shielding layer of the first light-emitting unit on the first side is located outside an end of the laminating structure of the first light-emitting unit by equal to or greater than $d \times \tan(\arcsin(\sin \theta L/ns))$ and equal to or less than $3d \times \tan(\arcsin(\sin \theta L/ns))$, wherein an angle between a perpendicular line from the first location to the substrate and the first light-emitting unit is an angle $\theta L$.

3. The light-emitting device according to claim 1, wherein the light shielding layer functions as a second electrode.

4. The light-emitting device according to claim 1, wherein the angle $\theta L$ is an angle between the perpendicular line from the first location to the substrate and an end of the first light-emitting unit opposing the first side.

5. The light-emitting device according to claim 1, wherein the first width is longer than the second width.

6. A light-emitting device comprising:
a plurality of light-emitting units located on a first surface side of a substrate, the first surface side extending between a first side and a second side opposing each other, each light-emitting unit including a light shielding layer; and
a plurality of light-transmitting unit located between the plurality of light-emitting units adjacent to each other,
wherein each of the plurality of light-emitting units comprises a laminating structure of a first electrode, an organic layer, and the light shielding layer laminated in this order,
wherein the plurality of light-emitting units comprises:
a first light-emitting unit that is the closest to the second side than any of the other of the plurality of light-emitting units, and
a second light-emitting unit located closer to the first side than the first light-emitting unit,
wherein the light shielding layer of the first light-emitting unit extends from a first end to a second end, the first end located outside a third end of the laminating structure of the first light-emitting unit on the first side, the second end located outside a fourth end of the laminating structure of the first light-emitting unit on the second side,
wherein the light shielding layer of the first light-emitting unit comprises:
a first width extending from the third end of the laminating structure of the first light-emitting unit to the the first end of the light shielding layer of the first light-emitting unit, and
a second width extending from the fourth end of the laminating structure of the first light-emitting unit to the second end of the light shielding layer of the first light-emitting unit,
wherein the light shielding layer of the second light-emitting unit extends from a fifth end to a sixth end, the fifth end located outside a seventh end of the laminating structure of the second light-emitting unit on the first side, the sixth end located outside an eighth end of the laminating structure of the second light-emitting unit on the second side, wherein the light shielding layer of the second light-emitting unit comprises a third width extending from the seventh end of the laminating structure of the second light-emitting unit to the fifth end of the light shielding layer of the second light-emitting unit, wherein the plurality of light transmitting units comprises:
  a first light transmitting unit that extends from the first end of the light shielding layer of the first light-emitting unit to the sixth end of the light shielding layer of the second light-emitting unit, and
  a second light transmitting unit that extends from the fifth end of the light shielding layer of the second light-emitting unit, wherein the first width is:
  equal to or greater than 30.8 μm and equal to or less than 256.7 μm when a thickness of the substrate is equal to or greater than 100 μm and equal to or less than 300 μm and a refractive index of the substrate is 1.5; or
  equal to or greater than 2.9 μm and equal to or less than 39.6 μm when the thickness of the substrate is equal to or greater than 10 μm and equal to or less than 50 μm and the refractive index the substrate is 1.6, and wherein the first width is different than the second width, and wherein the third width is shorter than the first width.

7. A light-emitting device comprising:
a plurality of light-emitting units located on a first surface side of a substrate, the first surface side extending between a first side and a second side opposing each other, each light-emitting unit comprising a light shielding layer; and
a plurality of light-transmitting unit located between the plurality of light-emitting units adjacent to each other,
wherein each of the plurality of light-emitting units comprises a laminating structure of a first electrode, an organic layer, and the light shielding layer laminated in this order,
wherein the plurality of light-emitting units comprises:
  a first light-emitting unit that is the closest to the second side than any of the other of the plurality of light-emitting units, and
  a second light-emitting unit located closer to the first side than the first light-emitting unit,
wherein the light shielding layer of the first light-emitting unit extends from a first end to a second end, the first end located outside a third end of the laminating structure of the first light-emitting unit on the first side, the second end located outside a fourth end of the laminating structure of the first light-emitting unit on the second side,
wherein the light shielding layer of the first light-emitting unit comprises:
  a first width extending from the third end of the laminating structure of the first light-emitting unit to the the first end of the light shielding layer of the first light-emitting unit, and
  a second width extending from the fourth end of the laminating structure of the first light-emitting unit to the second end of the light shielding layer of the first light-emitting unit,
wherein the light shielding layer of the second light-emitting unit extends from a fifth end to a sixth end, the fifth end located outside a seventh end of the laminating structure of the second light-emitting unit on the first side, the sixth end located outside an eighth end of the laminating structure of the second light-emitting unit on the second side, wherein the light shielding layer of the second light-emitting unit comprises a third width extending from the seventh end of the laminating structure of the second light-emitting unit to the fifth end of the light shielding layer of the second light-emitting unit, wherein the plurality of light transmitting units comprises:
  a first light transmitting unit that extends from the first end of the light shielding layer of the first light-emitting unit to the sixth end of the light shielding layer of the second light-emitting unit, and
a second light transmitting unit that extends from the fifth end of the light shielding layer of the second light-emitting unit, wherein the first width is:
  equal to or greater than 5.8 μm and equal to or less than 6.4 μm;
  equal to or greater than 8.1 μm and equal to or less than 8.9 μm;
  equal to or greater than 14.4 μm and equal to or less than 15.9 μm;
  equal to or greater than 30.8 μm and equal to or less than 34.1 μm;
  equal to or greater than 43.3 μm and equal to or less than 47.8 μm; or
  equal to or greater than 77.4 μm and equal to or less than 85.6 μm, and wherein the first width is different than the second width, and wherein the third width is shorter than the first width.

8. A light-emitting system comprising:
a first location; and
a light-emitting device,
wherein the light-emitting device comprises:
  a plurality of light-emitting units located on a first surface side of a substrate having a thickness d and a refractive index ns, the first surface side extending from a first side to a second side, each light-emitting unit comprising a light shielding layer; and
  a plurality of light-transmitting unit located between the plurality of light-emitting units adjacent to each other,
wherein each of the plurality of light-emitting units comprises a laminating structure of a first electrode, an organic layer, and the light shielding layer laminated in this order,
wherein the plurality of light-emitting units comprises:
  a first light-emitting unit located the farthest from the first side than any of the other of the plurality of light-emitting units, and
  a second light-emitting unit located closer to the first side than the first light-emitting unit,
wherein the light shielding layer of the first light-emitting unit extends from a first end to a second end, the first end located outside a third end of the laminating structure of the first light-emitting unit on the first side, the second end located outside a fourth end of the laminating structure of the first light-emitting unit on the second side,
wherein the light shielding layer of the first light-emitting unit comprises:
  a first width extending from the third end of the laminating structure of the first light-emitting unit to the the first end of the light shielding layer of the first light-emitting unit, and a second width extending from the fourth end of the laminating structure of the first light-emitting unit to the second end of the light shielding layer of the first light-emitting unit, wherein the light shielding layer of the second light-emitting unit extends from a fifth end to a sixth end, the fifth end located outside a seventh end of the laminating structure of the second light-emitting unit on the first side, the sixth end located outside an eighth end of the laminating structure of the second light-emitting unit on the second side, wherein the light shielding layer of the second light-emitting unit comprises a third width extending from the seventh end of the laminating structure of the second light-emitting unit to the fifth end of the light shielding layer of the second light-emitting unit, wherein the plurality of light transmitting units comprises:

a first light transmitting unit that extends from the first end of the light shielding layer of the first light-emitting unit to the sixth end of the light shielding layer of the second light-emitting unit, and a second light transmitting unit that extends from the fifth end of the light shielding layer of the second light-emitting unit, wherein the first width is different than the second width, and wherein the third width is shorter than the first width.

9. The light-emitting system according to claim 8, wherein the first location is a driver's seat of an automobile, and wherein the light-emitting device is installed on a rear portion of the automobile.

\* \* \* \* \*